US012663712B2

(12) United States Patent
Hattori

(10) Patent No.: US 12,663,712 B2
(45) Date of Patent: Jun. 23, 2026

(54) FORMING METHOD, FORMING APPARATUS, AND ARTICLE MANUFACTURING METHOD

(71) Applicant: CANON KABUSHIKI KAISHA, Tokyo (JP)

(72) Inventor: Tadashi Hattori, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 107 days.

(21) Appl. No.: 18/538,117

(22) Filed: Dec. 13, 2023

(65) Prior Publication Data

US 2024/0208134 A1 Jun. 27, 2024

(30) Foreign Application Priority Data

Dec. 26, 2022 (JP) ................................. 2022-208798

(51) Int. Cl.
| | |
|---|---|
| *G03F 7/00* | (2006.01) |
| *B29C 59/00* | (2006.01) |
| *B29C 59/02* | (2006.01) |
| *G03F 9/00* | (2006.01) |

(52) U.S. Cl.
CPC ............ *G03F 7/0002* (2013.01); *B29C 59/02* (2013.01); *G03F 9/7042* (2013.01); *B29C 59/002* (2013.01)

(58) Field of Classification Search
CPC ...... G03F 7/0002; G03F 9/7042; B29C 59/02
See application file for complete search history.

(56) References Cited

U.S. PATENT DOCUMENTS

| | | | | | |
|---|---|---|---|---|---|
| 6,151,121 | A | * | 11/2000 | Mishima | ............... G03F 9/7092 356/399 |
| 2005/0128452 | A1 | * | 6/2005 | Matsumoto | ........... G03F 9/7011 355/55 |

(Continued)

FOREIGN PATENT DOCUMENTS

| | | |
|---|---|---|
| JP | 2017183364 A | 10/2017 |
| JP | 2021057511 A | 4/2021 |

(Continued)

OTHER PUBLICATIONS

EAG, Ellipsometry, Jan. 28, 2020—NPL attached, p. 1, https://web.archive.org/web/20200128095811/https://www.eag.com/techniques/spectroscopy/spectroscopic-ellipsometry/ (Year: 2020).*

*Primary Examiner* — Jerzi H Moreno Hernandez
(74) *Attorney, Agent, or Firm* — ROSSI, KIMMS & McDOWELL LLP

(57) ABSTRACT

A forming method of forming a composition on an underlying film of a substrate by using a mold includes detecting, as an index indicating a state of the underlying film, at least one of an intensity and a wavelength of reflected light obtained from the substrate by irradiating the substrate with light; determining, based on the detected index, a measurement condition for measuring a position of a mark of the substrate; bringing the mold and the composition on the substrate into contact with each other; and measuring, after the bringing, in a contact state in which the mold and the composition are in contact with each other, the position of the mark of the substrate under the determined measurement condition, wherein the detecting and the determining are performed before the bringing.

12 Claims, 17 Drawing Sheets

(56)　　　　　　　References Cited

U.S. PATENT DOCUMENTS

2016/0167261  A1*　6/2016　Aihara ................. G03F 7/0002
　　　　　　　　　　　　　　　　　　　　　264/408
2019/0122358  A1*　4/2019　Murayama ........... G03F 9/7092
2020/0307038  A1*　10/2020　Nakayama ........... G03F 7/0002
2021/0096462  A1　4/2021　Ito et al.

FOREIGN PATENT DOCUMENTS

KR　　1020170092649  A　　8/2017
KR　　1020200115139  A　　10/2020

* cited by examiner

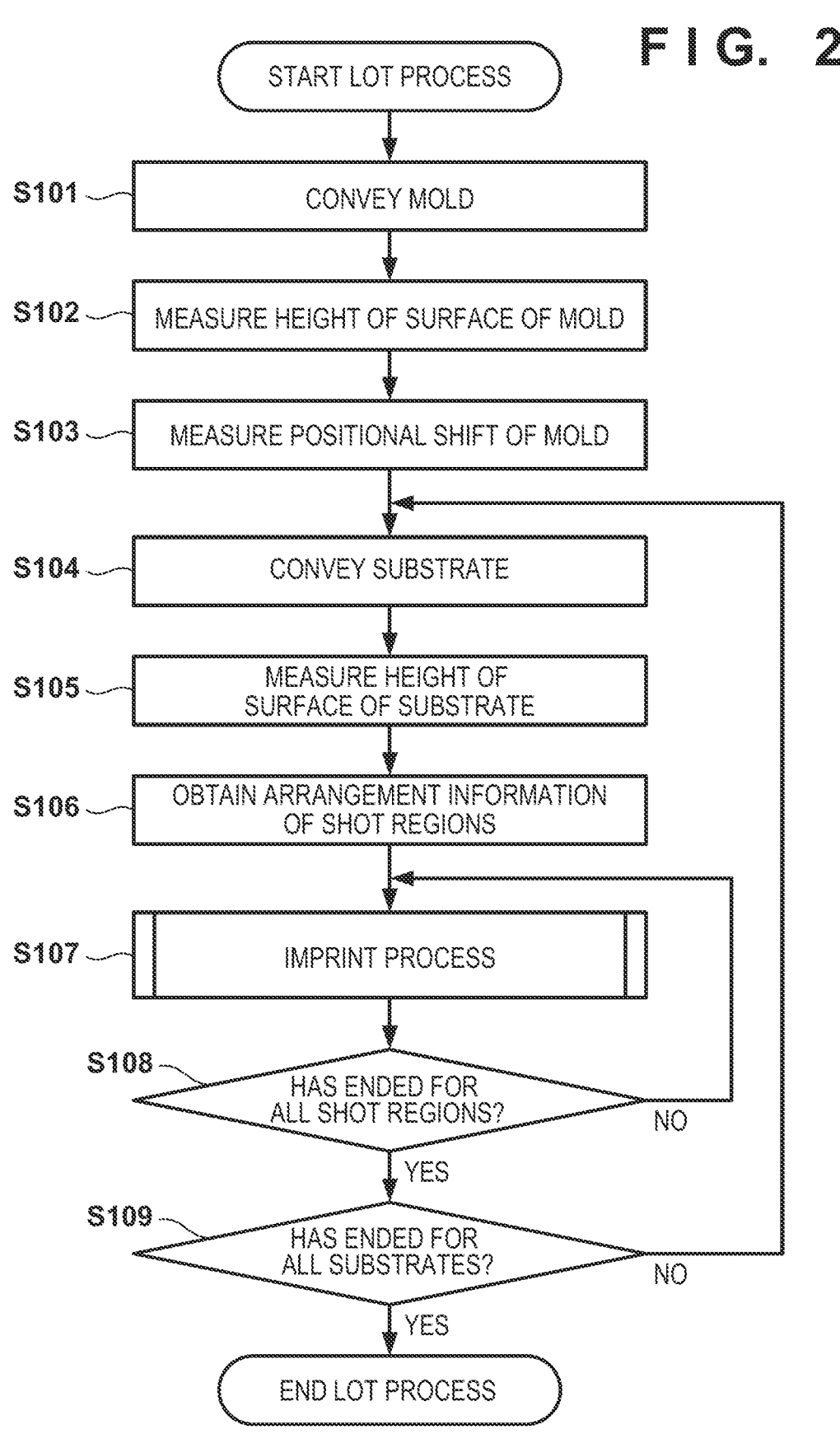
F I G.  2

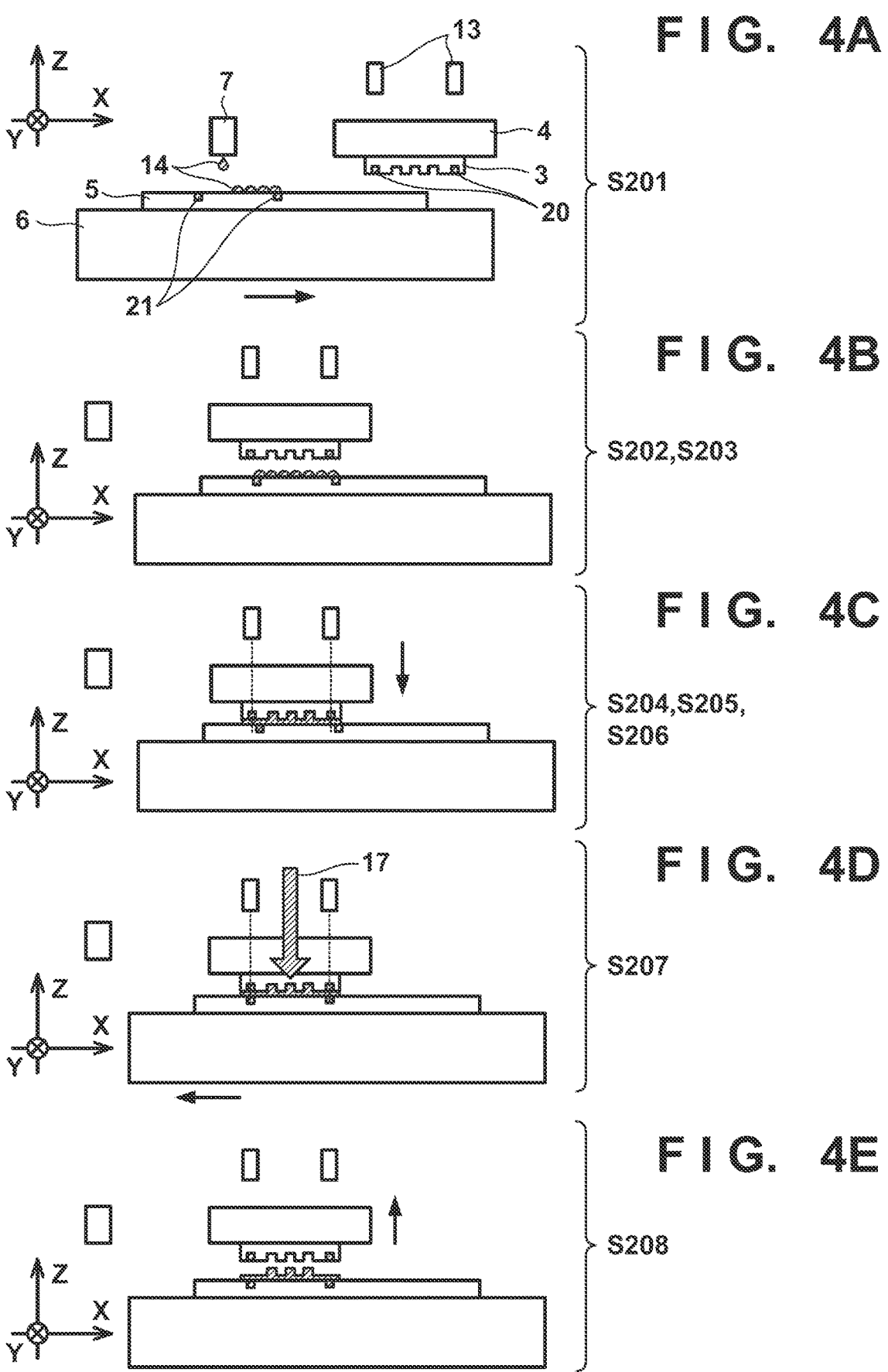
F I G.  4A
S201
F I G.  4B
S202,S203
F I G.  4C
S204,S205,
S206
F I G.  4D
S207
F I G.  4E
S208

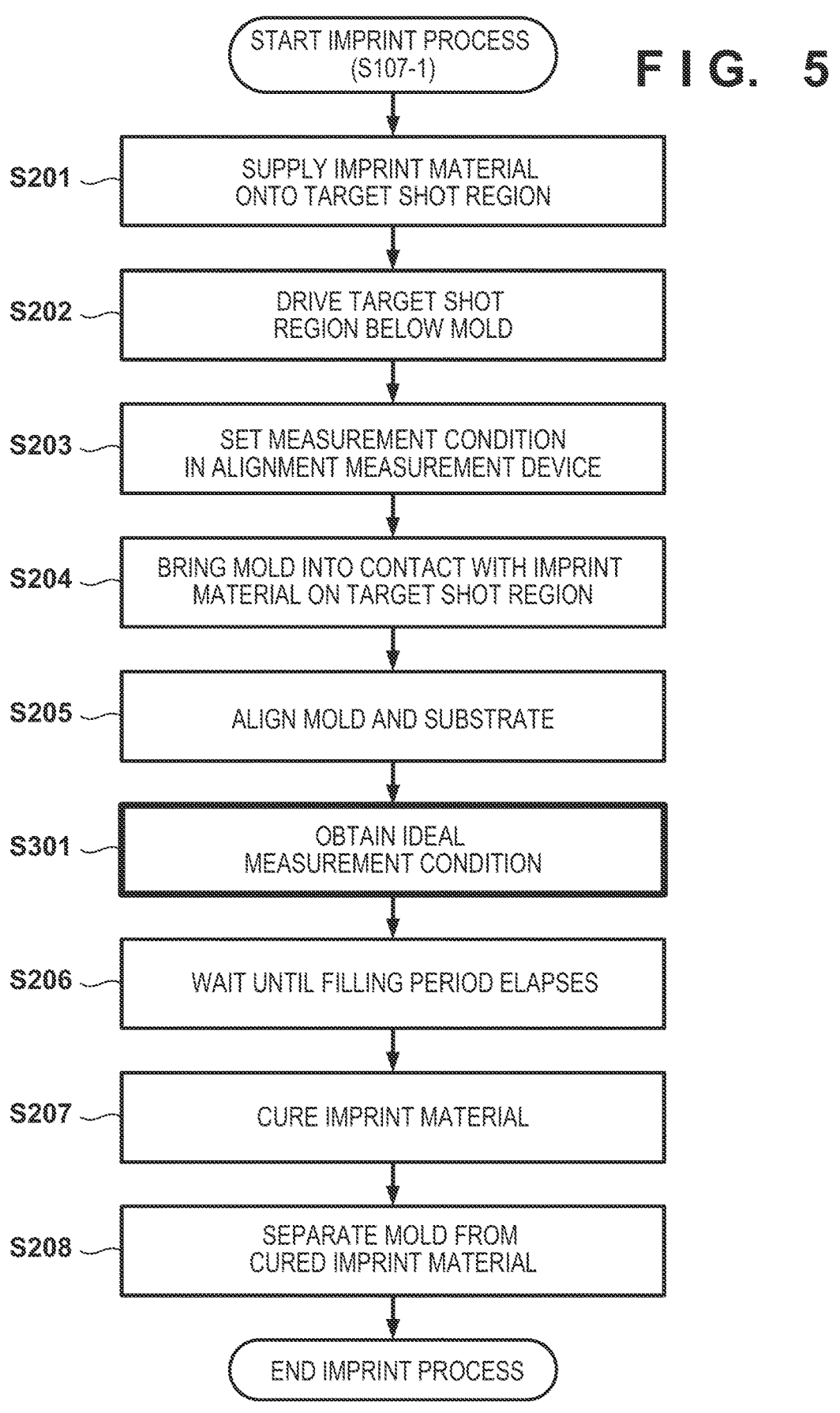

FIG. 5

START IMPRINT PROCESS
(S107-1)

S201 — SUPPLY IMPRINT MATERIAL
ONTO TARGET SHOT REGION

S202 — DRIVE TARGET SHOT
REGION BELOW MOLD

S203 — SET MEASUREMENT CONDITION
IN ALIGNMENT MEASUREMENT DEVICE

S204 — BRING MOLD INTO CONTACT WITH IMPRINT
MATERIAL ON TARGET SHOT REGION

S205 — ALIGN MOLD AND SUBSTRATE

S301 — OBTAIN IDEAL
MEASUREMENT CONDITION

S206 — WAIT UNTIL FILLING PERIOD ELAPSES

S207 — CURE IMPRINT MATERIAL

S208 — SEPARATE MOLD FROM
CURED IMPRINT MATERIAL

END IMPRINT PROCESS

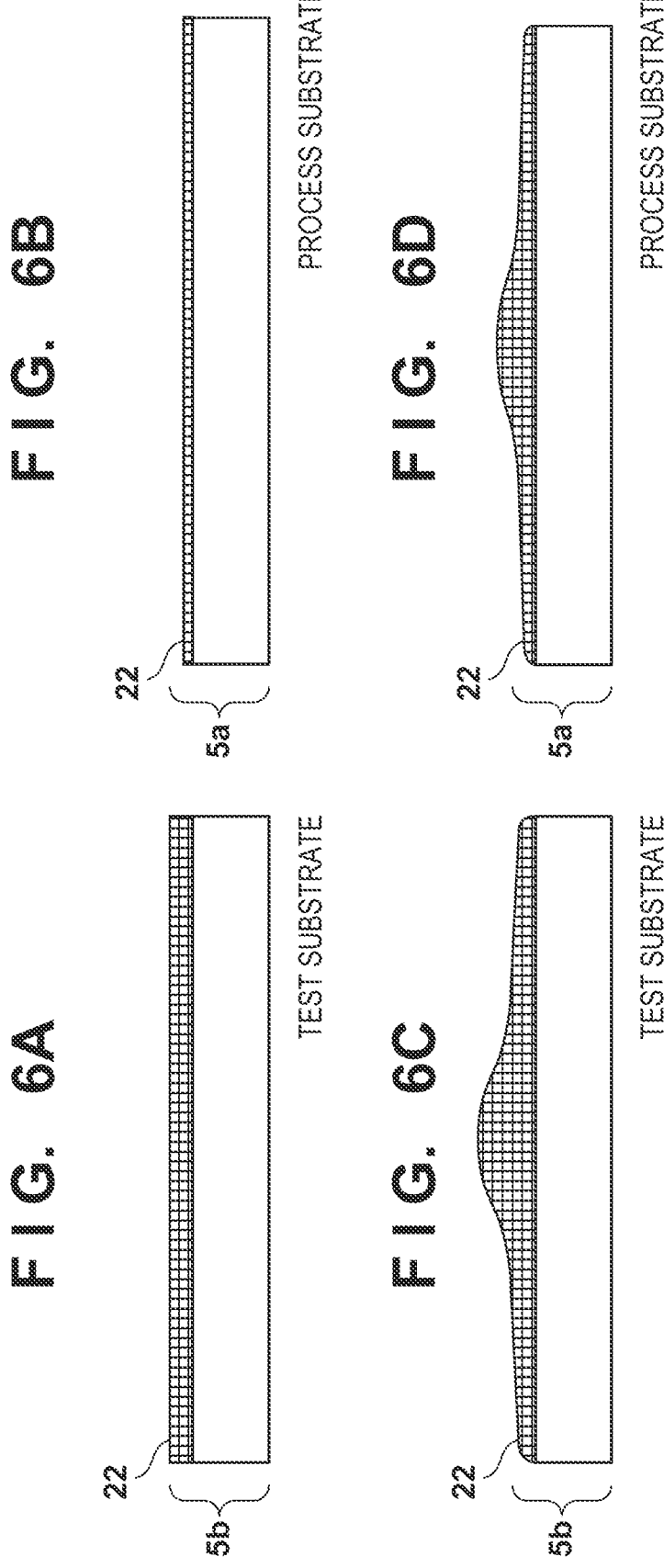

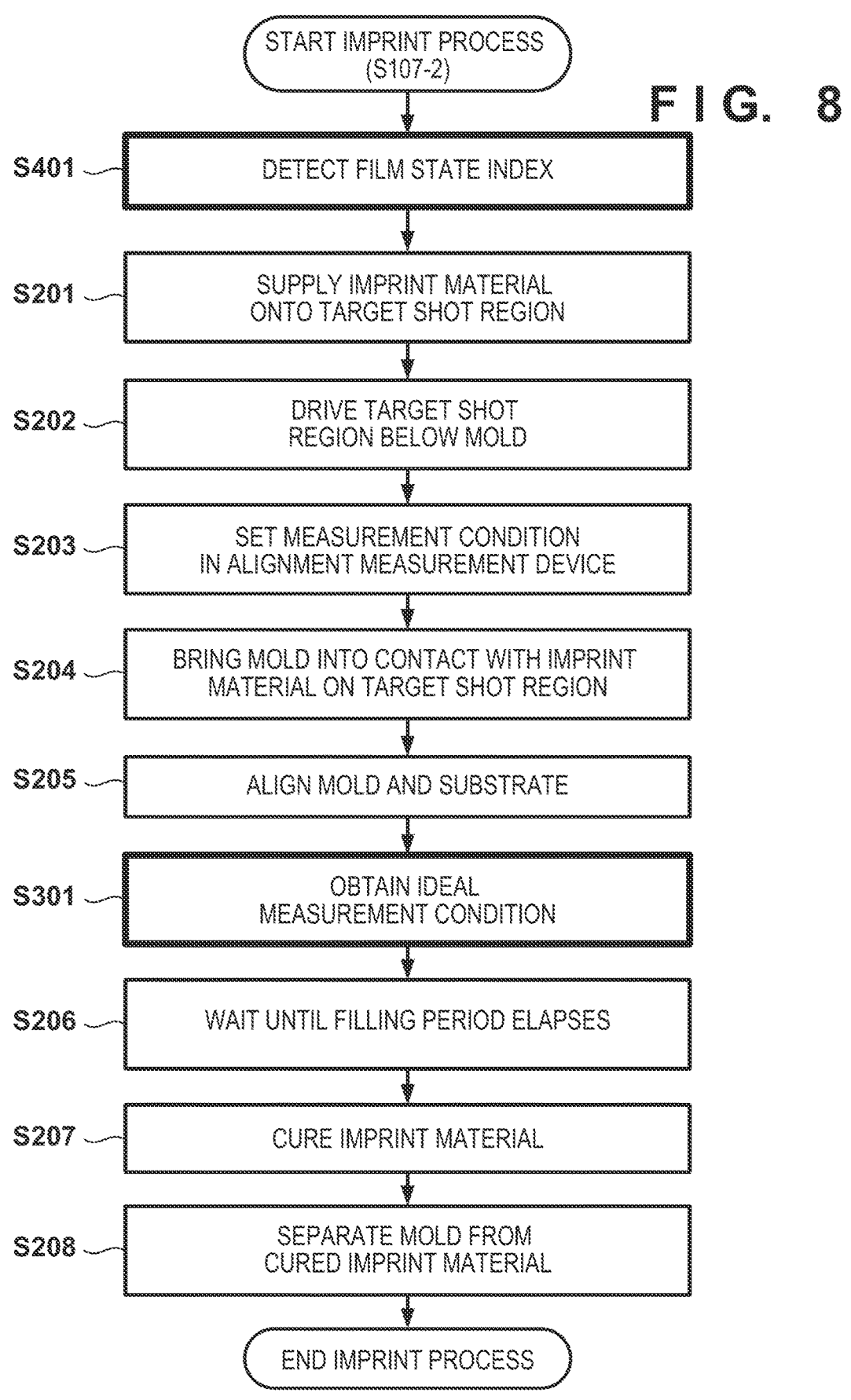

F I G. 8

START IMPRINT PROCESS
(S107-2)

S401 — DETECT FILM STATE INDEX

S201 — SUPPLY IMPRINT MATERIAL
ONTO TARGET SHOT REGION

S202 — DRIVE TARGET SHOT
REGION BELOW MOLD

S203 — SET MEASUREMENT CONDITION
IN ALIGNMENT MEASUREMENT DEVICE

S204 — BRING MOLD INTO CONTACT WITH IMPRINT
MATERIAL ON TARGET SHOT REGION

S205 — ALIGN MOLD AND SUBSTRATE

S301 — OBTAIN IDEAL
MEASUREMENT CONDITION

S206 — WAIT UNTIL FILLING PERIOD ELAPSES

S207 — CURE IMPRINT MATERIAL

S208 — SEPARATE MOLD FROM
CURED IMPRINT MATERIAL

END IMPRINT PROCESS

F I G.  10

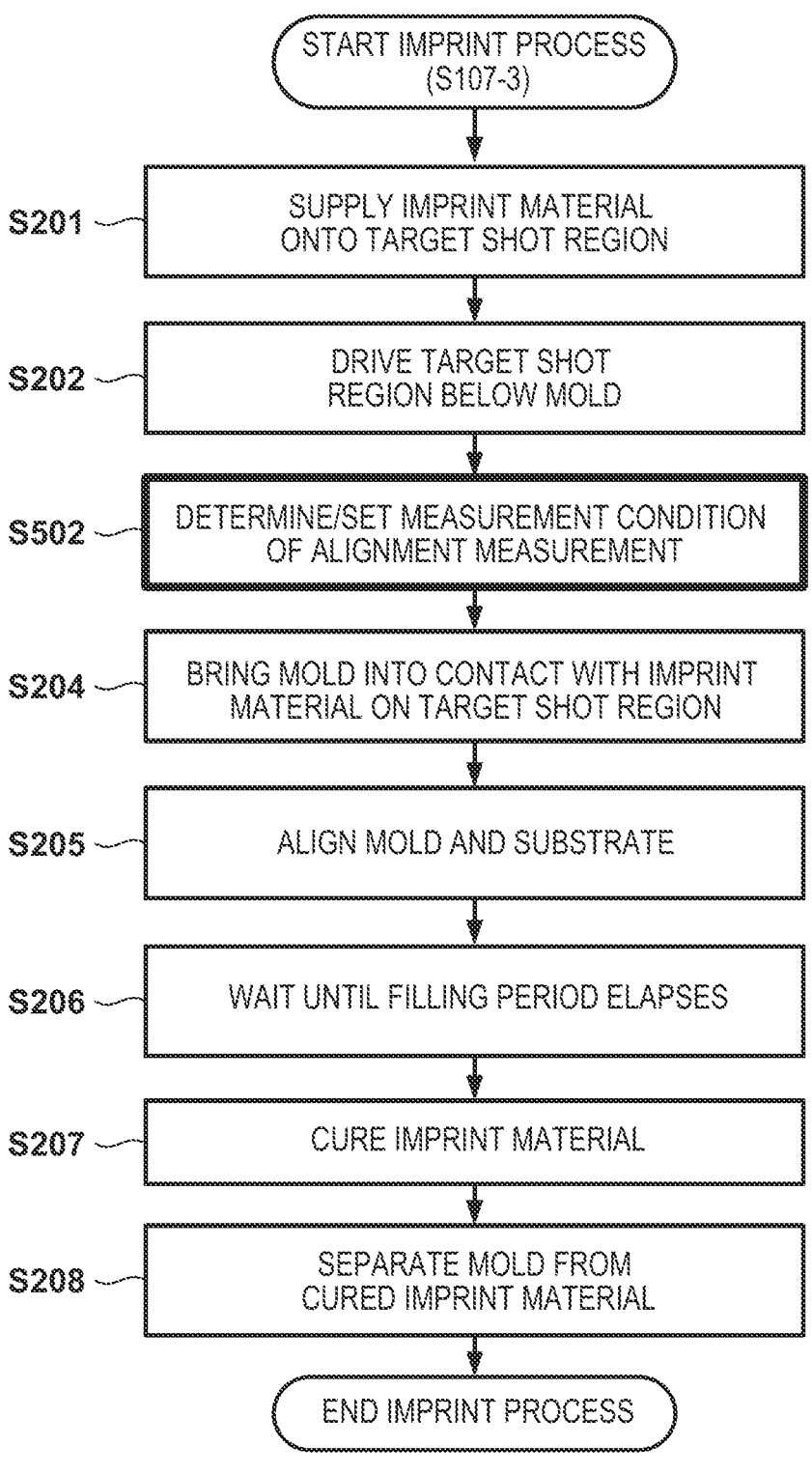

START IMPRINT PROCESS
(S107-3)

S201 — SUPPLY IMPRINT MATERIAL
ONTO TARGET SHOT REGION

S202 — DRIVE TARGET SHOT
REGION BELOW MOLD

S502 — DETERMINE/SET MEASUREMENT CONDITION
OF ALIGNMENT MEASUREMENT

S204 — BRING MOLD INTO CONTACT WITH IMPRINT
MATERIAL ON TARGET SHOT REGION

S205 — ALIGN MOLD AND SUBSTRATE

S206 — WAIT UNTIL FILLING PERIOD ELAPSES

S207 — CURE IMPRINT MATERIAL

S208 — SEPARATE MOLD FROM
CURED IMPRINT MATERIAL

END IMPRINT PROCESS

F I G. 12A
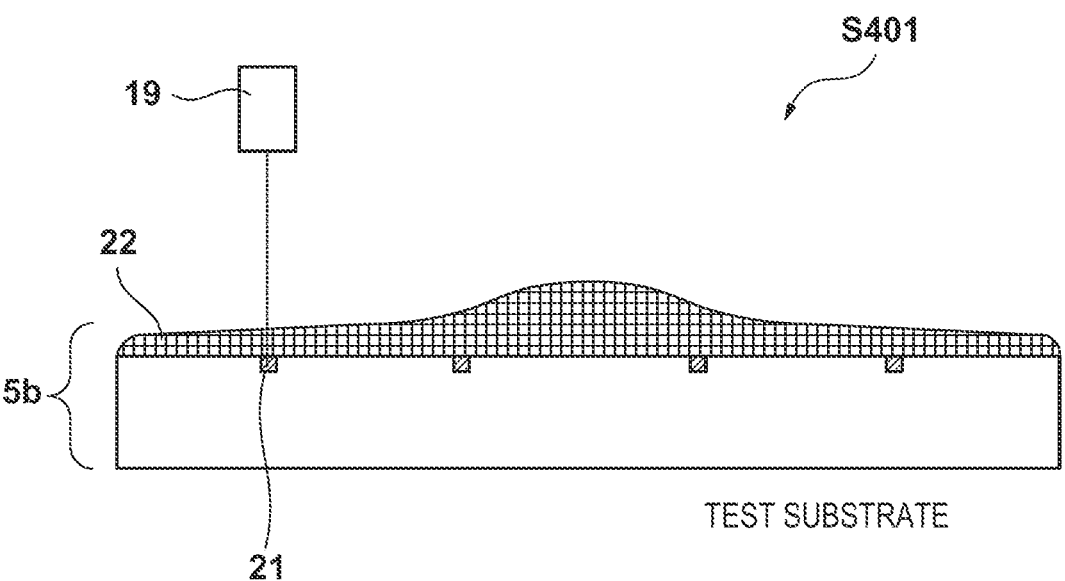
TEST SUBSTRATE
F I G. 12B
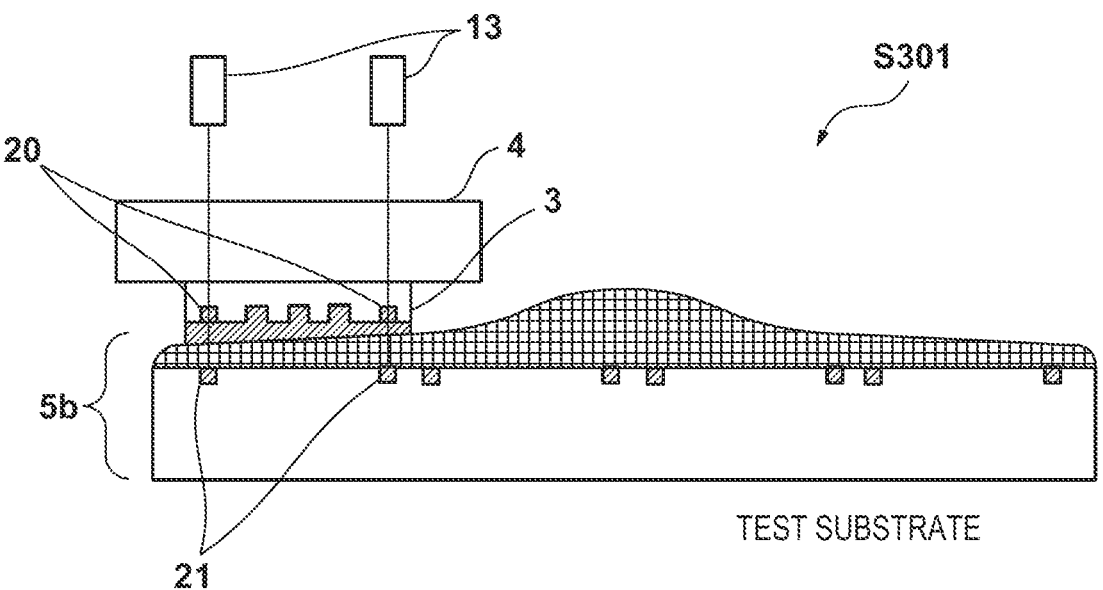
TEST SUBSTRATE

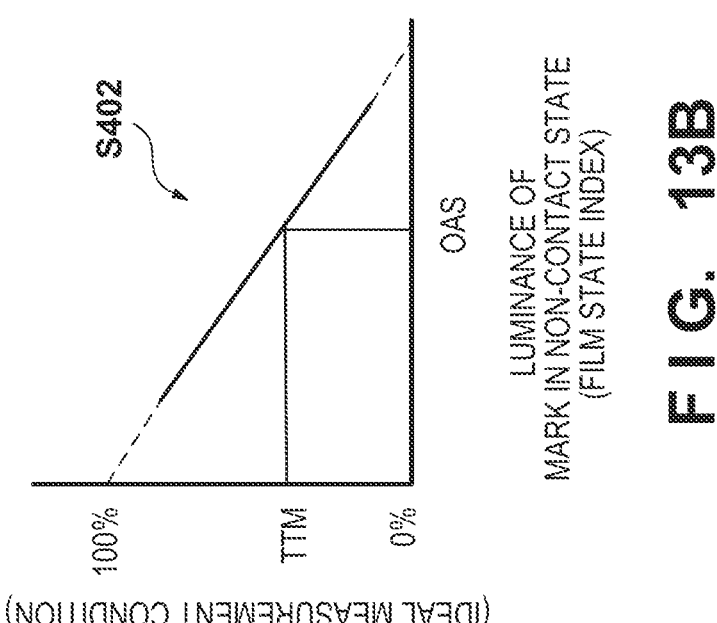
F I G. 13B
F I G. 13A

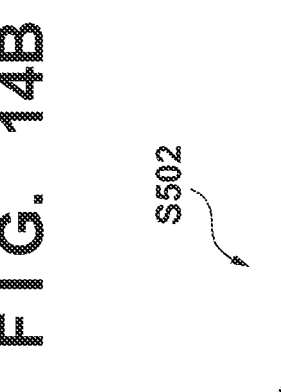
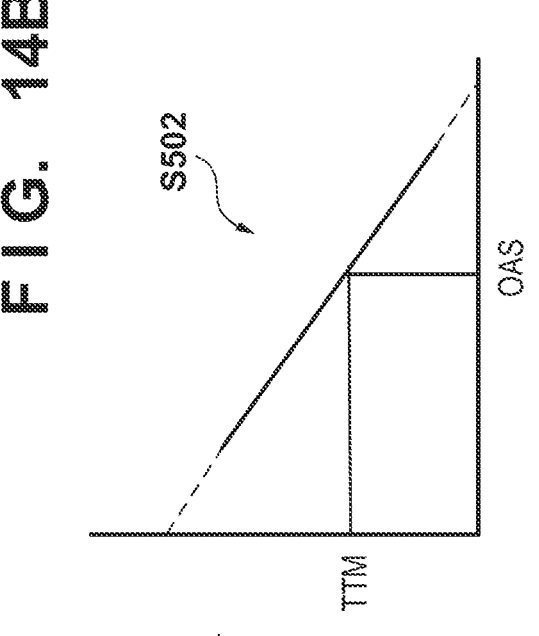
FIG. 14B
FIG. 14A
FIG. 14C
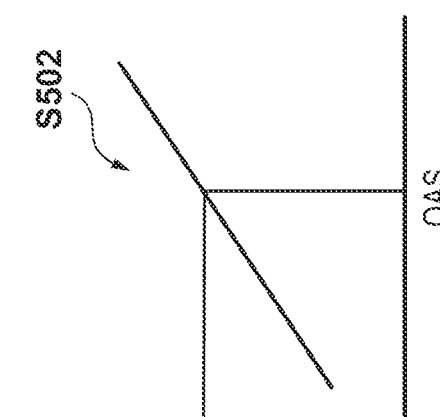
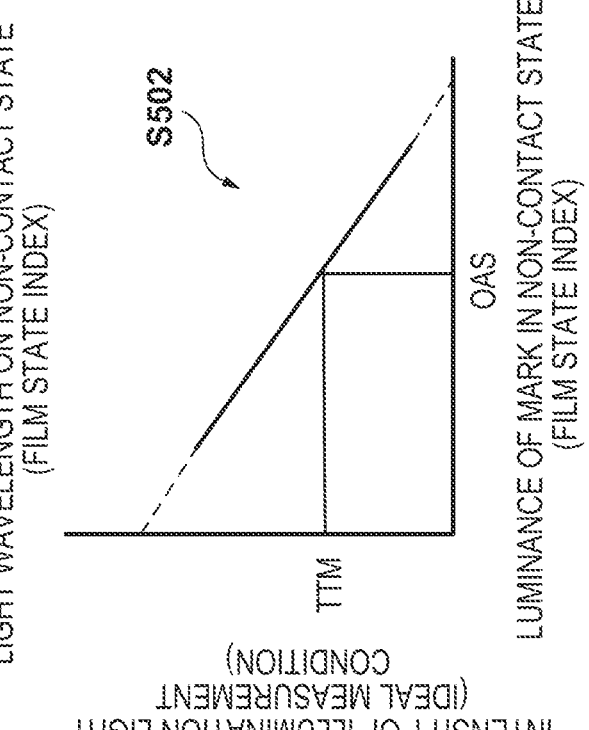

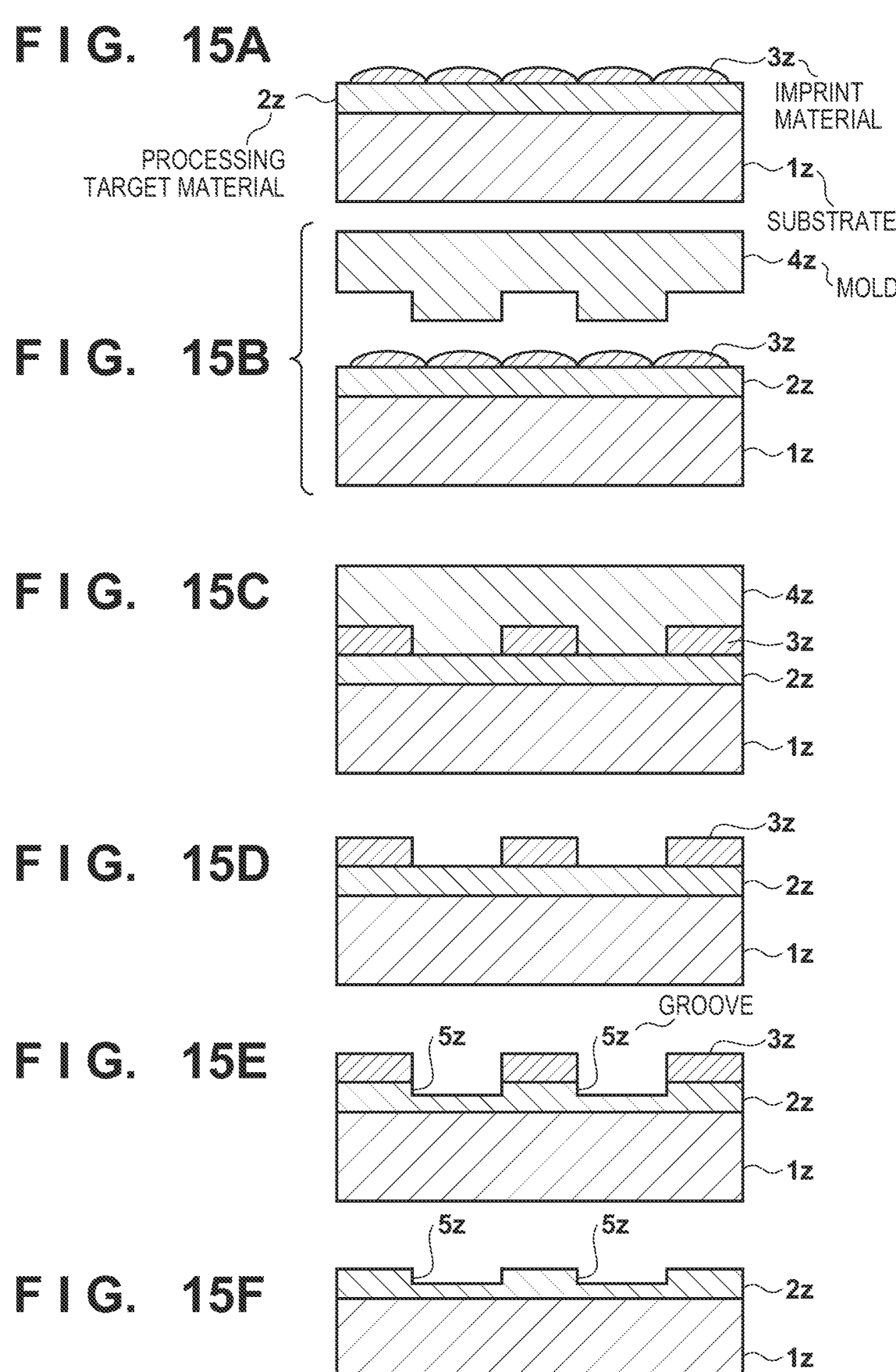
F I G.  15A
F I G.  15B
F I G.  15C
F I G.  15D
F I G.  15E
F I G.  15F

FORMING METHOD, FORMING APPARATUS, AND ARTICLE MANUFACTURING METHOD

BACKGROUND OF THE INVENTION

Field of the Invention

The present invention relates to a forming method, a forming apparatus, and an article manufacturing method.

Description of the Related Art

An imprint apparatus that forms an imprint material on a substrate by using a mold including a pattern surface, in which a convex-concave pattern been formed, has attracted attention as one of mass-production lithography apparatuses for semiconductor devices or the like. The imprint apparatus can cure the imprint material in a state in which the mold and the imprint material on the substrate are in contact with each other, and separate the mold from the cured imprint material, thereby forming, on the substrate, a convex-concave pattern of a cured product of the imprint material.

In the imprint apparatus, in the contact state in which the mold and the imprint material on the substrate are in contact with each other, the relative position between a mark provided on the mold and a mark provided on the substrate is measured. Based on the measurement result, alignment between the mold and the substrate can be performed. In such alignment, it is desirable to adjust the measurement condition (for example, the illumination condition for illuminating the mark) so that the marks provided on the mold and the substrate can be accurately measured. Japanese Patent Laid-Open No. 2017-183364 describes that a mark of the second substrate different from the first substrate is illuminated using the illumination condition adjusted in the contact state to illuminate a mark of the first substrate. Japanese Patent Laid-Open No. 2021-57511 describes that, by performing function approximation on the illumination condition adjusted in the contact state for each of a plurality of first shot regions of a substrate, the illumination condition for the second shot region different from the plurality of first shot regions of the substrate is derived.

An underlying film may be provided on the mark of the substrate. Due to the influence of a production error or the like, the state (for example, thickness) of such the underlying film can change for each substrate and/or each shot region. In this case, the appearance of the mark can change for each substrate and/or each shot region. Hence, it is preferable to individually set the measurement condition for accurately measuring the mark of the substrate for each substrate and/or each shot region. However, adjusting the measurement condition in the contact state for each substrate and/or each shot region can be disadvantageous in terms of throughput.

SUMMARY OF THE INVENTION

The present invention provides, for example, a technique advantageous in achieving both the measurement accuracy of a mark of a substrate and throughput.

According to one aspect of the present invention, there is provided a forming method of forming a composition on an underlying film of a substrate by using a mold, the method including: detecting, as an index indicating a state of the underlying film, at least one of an intensity and a wavelength of reflected light obtained from the substrate by irradiating the substrate with light; determining, based on the index detected in the detecting, a measurement condition for measuring a position of a mark of the substrate; bringing the mold and the composition on the substrate into contact with each other; and measuring, after the bringing, in a contact state in which the mold and the composition are in contact with each other, the position of the mark of the substrate under the measurement condition determined in the determining, and aligning the mold and the substrate based on a measurement result, wherein the detecting is performed before the bringing.

Further features of the present invention will become apparent from the following description of exemplary embodiments with reference to the attached drawings.

BRIEF DESCRIPTION OF THE DRAWINGS

FIG. 2 is a flowchart illustrating a basic imprint method;

FIGS. 4A to 4E are views showing operations of the imprint apparatus in respective steps of the flowchart of FIG. 3;

FIG. 5 is a flowchart illustrating a conventional method of determining a measurement condition by using a test substrate;

FIGS. 6A to 6D are views each showing an example of the underlying film of the substrate;

FIG. 8 is a flowchart illustrating an imprint process for a shot region of the test substrate in the first embodiment;

FIG. 10 is a flowchart illustrating an imprint process for a shot region of the process substrate in the first embodiment;

FIGS. 12A to 12F are views for explaining a method of determining a measurement condition in the second embodiment;

FIGS. 13A and 13B are views for explaining correspondence relationship information in the third embodiment;

FIGS. 14A to 14C are views for explaining correspondence relationship information in the fourth embodiment; and FIGS. 15A to 15F are views for explaining an article manufacturing method.

DESCRIPTION OF THE EMBODIMENTS

Figure 1:
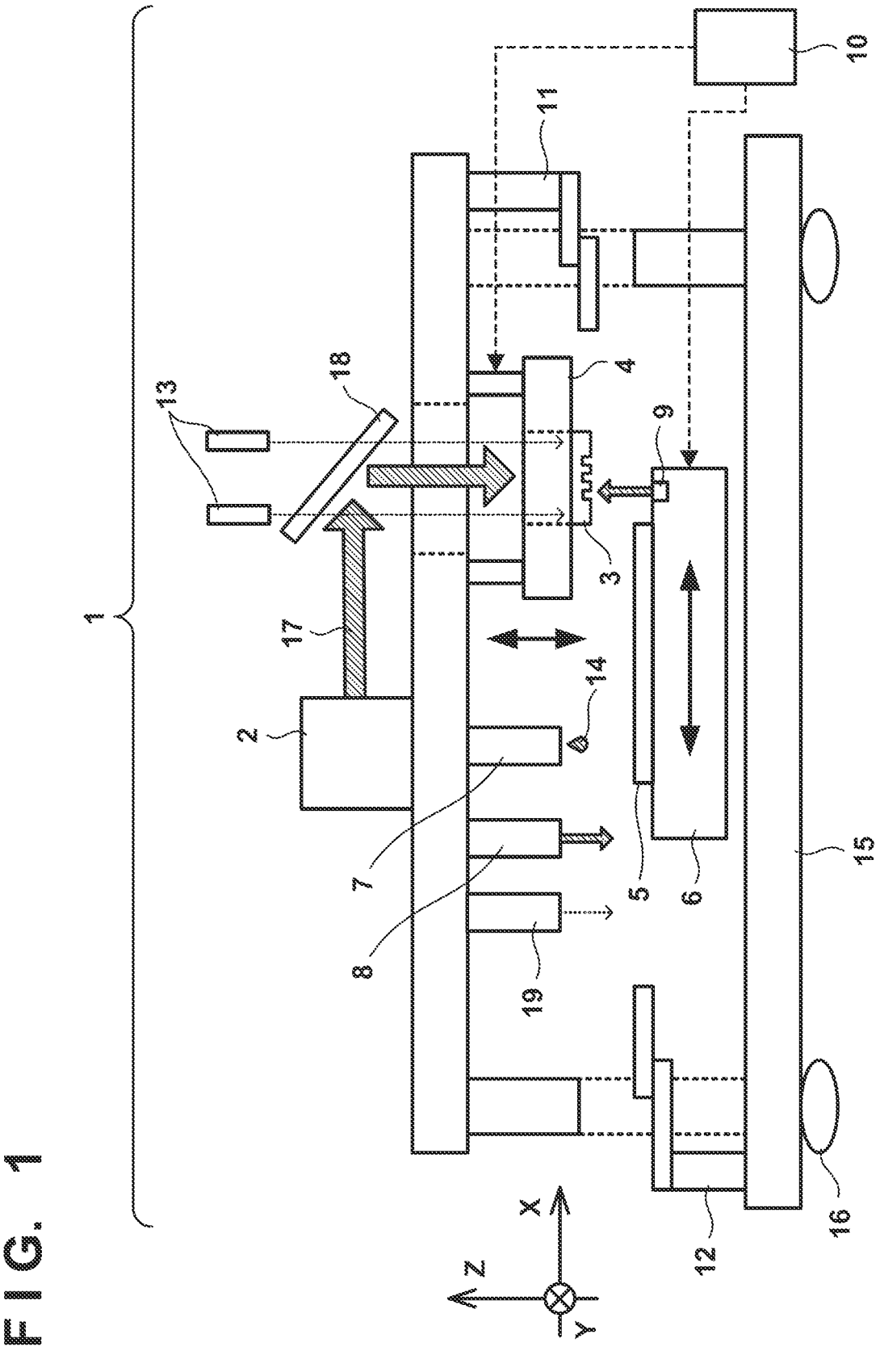
FIG. 1 is a schematic view showing an example of the arrangement of an imprint apparatus.

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate. Furthermore, in the attached drawings, the same reference numerals are given to the same or similar configurations, and redundant description thereof is omitted.

In the specification and the accompanying drawings, directions will be indicated on an XYZ coordinate system in which directions parallel to the surface of a substrate are defined as the X-Y plane, unless otherwise specified. Directions parallel to the X-axis, the Y-axis, and the Z-axis of the XYZ coordinate system are the X direction, the Y direction, and the Z direction, respectively. A rotation about the X-axis, a rotation about the Y-axis, and a rotation about the Z-axis are θX, θY, and θZ, respectively. Control or driving concerning the X-axis, the Y-axis, and the Z-axis means control or driving concerning a direction parallel to the X-axis, a direction parallel to the Y-axis, and a direction parallel to the Z-axis, respectively. In addition, control or driving concerning the θX-axis, the θY-axis, and the θZ-axis means control or driving concerning a rotation about an axis parallel to the X-axis, a rotation about an axis parallel to the Y-axis, and a rotation about an axis parallel to the Z-axis, respectively. In addition, a position is information that can be specified based on coordinates on the X-, Y-, and Z-axes, and an orientation is information that can be specified by values on the θX-, θY-, and θZ-axes.

A forming apparatus is an apparatus that performs a forming process of forming a composition by pressing a mold against the composition on a substrate. Examples of the forming apparatus are an imprint apparatus and a planarization apparatus. The imprint apparatus is an apparatus that brings a mold including a convex-concave pattern (i.e. pattern with convex and concave portions) into contact with a composition (imprint material) on a substrate to form (transfer) the pattern on the composition. The forming process performed by the imprint apparatus is sometimes referred to as an imprint process. The planarization apparatus is an apparatus that planarizes the surface of a composition by bringing a mold having a flat surface into contact with the composition on a substrate. The forming process performed by the planarization apparatus is sometimes referred to as a planarization process. In the following description, the imprint apparatus will be exemplified as the forming apparatus, but arrangements/processes of the imprint apparatus can also be applied to the planarization apparatus.

The imprint apparatus is a lithography apparatus adopted for a manufacturing step (lithography step) of a semiconductor device, a magnetic storage medium, a liquid crystal display device, or the like. The imprint apparatus brings a mold and an imprint material supplied onto a substrate into contact with each other, and providing curing energy to the imprint material, thereby performing an imprint process of forming, on the substrate, a pattern of a cured product to which the pattern of the mold has been transferred. The imprint process is performed on each of a plurality of shot regions in the substrate. Note that the mold is sometimes referred to as a template or an original.

As the material of the substrate, for example, glass, a ceramic, a metal, a semiconductor, a resin, or the like can be used. A member made of a material different from the substrate may be provided on the surface of the substrate, as needed. The substrate is, for example, a silicon wafer, a compound semiconductor wafer, or silica glass. As the imprint material to be supplied onto the substrate, a curable composition (to be also referred to as a resin in an uncured state) to be cured by receiving curing energy is used. The curable composition is a composition cured by light irradiation or heating. Among these, the photo-curable composition cured by light irradiation contains at least a polymerizable compound and a photopolymerization initiator, and may further contain a nonpolymerizable compound or a solvent, as needed. The nonpolymerizable compound is at least one type of material selected from a group consisting of a sensitizer, a hydrogen donor, an internal mold release agent, a surfactant, an antioxidant, a polymer component, and the like. The viscosity (the viscosity at 25° C.) of the viscous material is, for example, 1 mPa·s (inclusive) to 100 mPa·s (inclusive).

FIG. 1 is a schematic view showing an example of the arrangement of an imprint apparatus 1. The imprint apparatus 1 is a processing apparatus that is used in a manufacturing step of a semiconductor device, and transfers the convex-concave pattern of a mold 3 serving as an original to a substrate 5 serving as a process target substrate. The imprint apparatus 1 is an apparatus employing a photo-curing method among the imprint techniques. Note that a description will be given below using the XYZ coordinate system in which the direction parallel to the irradiation axis of light irradiating the mold 3 is the Z direction, the direction in which the substrate 5 is moved in a plane perpendicular to the Z direction is the X direction, and the direction orthogonal to the X direction in the plane is the Y direction.

The imprint apparatus 1 can include an illumination unit 2, an imprint head 4, a stage 6, a supply unit 7, a first height measurement device 8, a second height measurement device 9, and a controller 10. The controller 10 is formed by, for example, a computer (information processing apparatus) including a processor such as a Central Processing Unit (CPU) and a storage unit such as a memory. The controller 10 is connected to the respective units of the imprint apparatus 1 by lines, and controls the respective units of the imprint apparatus 1 (controls an imprint process).

During the imprint process, the illumination unit 2 (curing unit) cures the imprint material by irradiating the imprint material on the substrate 5 with light 17 (for example, ultraviolet light) via the mold 3 in a state in which the mold 3 and the imprint material on the substrate 5 are in contact with each other. The illumination unit 2 can include, for example, a light source, and a plurality of optical elements for adjusting the light emitted from the light source to light suitable for the imprint process. In the imprint apparatus 1 shown in FIG. 1, the light 17 emitted from the illumination unit 2 is reflected by a half mirror 18 located above the imprint head 4, and applied to the imprint material on the substrate 5 via the mold 3.

The imprint head 4 is a holding apparatus (mold holding unit) for holding and fixing the mold 3. The imprint head 4 includes a mold chuck that holds the mold 3 conveyed by a mold conveyance unit 11, and a mold driving mechanism configured to be capable of changing the position and tilt of the mold 3 held by the mold chuck. The mold driving mechanism can include, for example, a Z-driving mechanism that drives the mold 3 in the Z direction to change the spacing between the mold 3 and the substrate 5 so as to press the mold 3 against the imprint material on the substrate 5 or separate the mold 3 from the cured imprint material. The mold driving mechanism may also include a tilt driving mechanism that tilts the mold 3, and the like.

The mold 3 held by the imprint head 4 can usually be formed from a material capable of transmitting ultraviolet light, such as silica glass. A partial region (pattern region) in the mold 3 includes a mesa portion formed in a mesa shape having a step of, for example, about several ten nm. The substrate-side surface of the mesa portion serves as a forming surface which is brought into contact with the imprint material on the substrate to form the imprint material. The forming surface of the mold 3 used in the imprint apparatus 1 is formed as a pattern surface in which a convex-concave pattern to be transferred to the imprint material on the substrate 5 has been formed in a three-dimensional shape. Note that the forming surface of a mold to be used in the planarization apparatus is formed as a flat surface in which a convex-concave pattern has not been formed.

An alignment measurement device 13 (measurement device) is provided above the imprint head 4 (more specifically, above the half mirror 18). The alignment measurement device 13 includes a Through The Mold (TTM) scope, and measures the relative position between an alignment mark provided on the mold 3 and an alignment mark provided on the substrate 5 through the half mirror 18. With this, the controller 10 can align the mold 3 (pattern region) and the substrate 5 (shot region) based on the measurement result of the alignment measurement device 13, that is, the relative positional shift in the X and Y directions between the mark of the mold 3 and the mark of the substrate 5. Note that the alignment measurement device 13 may be understood to detect the position of the alignment mark of the substrate 5 via the mold 3. The alignment mark may be simply referred to as the "mark" below.

The alignment measurement device 13 includes an optical system and an image capturing element (light receiving element) used to capture (observe) the mark of the mold 3 and the mark of the substrate 5. The alignment measurement device 13 can measure the relative positional shift in the X and Y directions between the mark of the mold 3 and the mark of the substrate 5 based on the image obtained by the image capturing element. The optical system can include a light source that emits light for illuminating the mark, a wavelength filter that selects the wavelength of the light emitted from the light source, and an ND filter used to adjust the intensity of the light entering the image capturing element. As the image capturing element (image sensor), a CCD image sensor, a CMOS image sensor, or the like can be used.

Here, the alignment measurement device 13 is arranged at a position where it measures the mark of the mold 3 and the mark of the substrate 5 through the half mirror 18, thereby not obstructing the optical path of the light 17 emitted from the illumination unit 2. In addition, by arranging a plurality of the alignment measurement devices 13 (TTM scopes), it is possible to simultaneously measure a plurality of marks. In this case, it is possible to measure the relative position between the mold 3 (pattern region) and the substrate 5 (shot region) not only in the X and Y directions but also in the rotational direction and the magnification direction. In general, the alignment measurement devices 13 are usually arranged with respect to the four corners of the pattern region of the mold 3. The imprint apparatus 1 may further include a mechanism that drives the alignment measurement device 13 in the X and Y directions. This is because various design coordinates of the mark are assumed depending on the design of the pattern formed in the mold 3. In a case in which a plurality of the alignment measurement devices 13 are arranged, it is desirable that each alignment measurement device 13 can be independently driven in the X and Y directions.

The stage 6 is configured to be movable on a stage plate 15 in the X and Y directions while holding the substrate 5. The stage can include, for example, a substrate chuck that holds, by a vacuum suction force or the like, the substrate 5 conveyed by a substrate conveyance unit 12, and a substrate driving mechanism configured to be capable of changing the position and tilt of the substrate 5 held by the substrate chuck. The substrate driving mechanism can include, for example, a driving mechanism that drives the substrate 5 in the X and Y directions, the Z direction, and the θZ direction (a rotational direction about the Z-axis), a tilt driving mechanism that tilts the substrate 5 in the θX direction and the θY direction, and the like. In this case, the upper surface of the stage plate 15 can be used as the reference of the position and tilt of the substrate 5 in each direction.

In the example of the imprint apparatus 1 shown in FIG. 1, a contact process of bringing the mold 3 and the imprint material on the substrate 5 into contact with each other by driving the mold 3 in the Z direction by the imprint head 4, and a mold separation process of separating the mold 3 from the cured imprint material are performed. However, the present invention is not limited to this, and the contact process and the mold separation process may be performed by driving the substrate 5 in the Z direction by the stage 6, or may be performed by relatively driving the mold 3 and the substrate 5 in the Z direction by both the imprint head 4 and the stage 6. Further, in the example of the imprint apparatus 1 shown in FIG. 1, the stage plate 15 is supported by a mount 16 (vibration isolator), and a vibration transmitted from the floor to the stage plate 15 is reduced by the mount 16.

The supply unit 7 supplies an imprint material 14 (for example, an uncured resin) onto the substrate 5. As the imprint material 14, an ultraviolet-light curable resin having a property of being cured by irradiation of ultraviolet light can be used.

The first height measurement device 8 measures the height of the substrate 5 by measuring the height of the surface (upper surface) of the substrate 5. The first height measurement device 8 includes, for example, a laser interferometer that detects the distance to the substrate 5 by irradiating the substrate 5 with light (laser beam). The first height measurement device 8 can measure the height (Z-direction position) of the substrate 5 based on the distance detected by the laser interferometer. In the example of the imprint apparatus 1 shown in FIG. 1, the height of each of a plurality of portions in the substrate 5 can be measured by driving the substrate 5 in the X and Y directions by the stage 6. With this, the controller 10 can obtain the height and tilt of the substrate 5 based on the measurement result of the first height measurement device 8 obtained at each of the plurality of portions in the substrate 5.

The second height measurement device 9 measures the height of the mold 3 by measuring the height of the surface (lower surface) of the mold 3. The second height measurement device 9 includes, for example, a laser interferometer that detects the distance to the mold 3 by irradiating the mold 3 with light (laser beam). The second height measurement device 9 can measure the height (Z-direction position) of the mold 3 based on the distance detected by the laser interferometer. In the example of the imprint apparatus 1 shown in FIG. 1, the second height measurement device 9 is provided on the stage 6 and moved together with the stage 6, thereby measuring the height of each of a plurality of portions in the mold 3. With this, the controller 10 can obtain the height and tilt of the mold 3 based on the measurement result of the second height measurement device 9 obtained at each of the plurality of portions in the mold 3.

The imprint apparatus 1 is further provided with a detector 19. The detector 19 includes an Off Axis Scope (OAS), and detects the mark of the substrate 5 without intervening the mold 3. The detector 19 may be understood to measure the position of the mark of the substrate 5 without intervening the mold 3. In the example of the imprint apparatus 1 shown in FIG. 1, the detector 19 can be used for global alignment to obtain the arrangement information of a plurality of shot regions in the substrate 5. More specifically, the controller 10 selects, as sample shot regions, at least two shot regions from the plurality of shot regions in the substrate 5. Then, the controller 10 causes the detector 19 to detect the marks respectively provided in the sample shot regions, and statistically processes the detection results, thereby obtaining the arrangement information of the plurality of shot regions in the substrate 5. The detector 19 can also be used to detect, as an index indicating the state of the underlying film of the substrate 5, at least one of the intensity and wavelength of reflected light obtained from the substrate 5 by irradiating the substrate 5 with light. Note that, since the detector 19 (OAS) has less constraints on arrangement than the alignment measurement device 13 (TTM scope), a scope having a high degree of optical freedom can easily be mounted. For example, the detector 19 can have a larger field of view or a higher measurement resolution than the alignment measurement device 13.

Next, a basic imprint method using the imprint apparatus 1 shown in FIG. 1 will be described. FIG. 2 is a flowchart illustrating a basic imprint method. The flowchart of FIG. 2 illustrates a lot process performed for one lot including a plurality of the substrates 5, and can be executed by the controller 10.

In step S101, the controller 10 causes the mold conveyance unit 11 to convey the mold 3 to the imprint head 4, and causes the imprint head 4 to hold the mold 3. Thus, the mold 3 is mounted on the imprint head 4. Then, in step S102, the controller 10 measures the height of the surface of the mold 3 by the second height measurement device 9. The height information of the mold 3 obtained in step S102 can be used to control the relative driving amount in the Z direction between the mold 3 and the substrate 5 upon bringing the mold 3 and the imprint material on the substrate into contact with each other in the imprint process. The controller 10 can also obtain the tilt information of the surface of the mold 3 by measuring the height at each of a plurality of portions of the surface of the mold 3 by the second height measurement device 9. This tilt information can be used to adjust the relative tilt between the mold 3 and the substrate 5 to make the surface of the mold 3 and the surface of the substrate 5 parallel to each other.

In step S103, the controller 10 measures the position of the mark of the mold 3 by the alignment measurement device 13, thereby measuring the positional shift (mold mounting positional shift) of the mold 3 with respect to the imprint head 4. For example, the controller 10 drives the position of the alignment measurement device 13 so that the mark of the mold 3 enters the field of view of the alignment measurement device 13. Then, in this state, the controller 10 causes the alignment measurement device 13 to measure the position of the mark of the mold 3, and calculates the positional shift amount from the design coordinates of the mark as the positional shift amount of the mold 3 with respect to the imprint head 4. The positional shift amount obtained in step S103 can be used as a correction value during driving the stage 6 so as to arrange the target shot region of the substrate 5 below the mold 3.

In step S104, the controller 10 causes the substrate conveyance unit 12 to convey, onto the stage 6, the substrate 5 on which the imprint process is to be performed, and causes the stage 6 to hold the substrate 5. Thus, the substrate 5 is mounted on the stage 6. Then, in step S105, the controller 10 measures the height of the surface of the substrate 5 by the first height measurement device 8. The height information of the substrate 5 obtained in step S105 can be used to control the relative driving amount in the Z direction between the mold 3 and the substrate 5 upon bringing the mold 3 and the imprint material on the substrate into contact with each other in the imprint process. The controller 10 can also obtain the tilt information of the surface of the substrate 5 by measuring the height at each of a plurality of portions of the surface of the substrate 5 by the first height measurement device 8. This tilt information can be used to adjust the relative tilt between the mold 3 and the substrate 5 to make the surface of the mold 3 and the surface of the substrate 5 parallel to each other.

In step S106, the controller 10 causes the detector 19 to detect the marks respectively provided in the sample shot regions of the substrate 5, and statistically processes the detection results, thereby obtaining the arrangement information of the plurality of shot regions in the substrate 5. For example, by causing the detector 19 to detect one mark for each sample shot region of the substrate 5, the controller 10 can obtain the arrangement information, in the X and Y directions, of the plurality of shot regions in the substrate 5. In addition, by causing the detector 19 to detect two or more marks for each sample shot region of the substrate 5, the controller 10 can further obtain the θZ-direction arrangement information of the plurality of shot regions in the substrate 5. The arrangement information of the plurality of shot regions in the substrate 5 can be obtained by statistic processing (calculation processing) such as function approximation. The arrangement information can be used to drive the stage 6 so as to arrange the target shot region of the substrate 5 below the mold 3.

In step S107, the controller 10 performs the imprint process on the shot region (to be sometimes referred to as the target shot region hereinafter) on which the imprint process is to be performed among the plurality of shot regions in the substrate 5. The details of step S107 will be described later. Then, in step S108, the controller 10 determines whether the imprint process has been performed for all the shot regions in the substrate 5. If there is a shot region having not undergone the imprint process, the controller 10 returns to step S107, and performs the imprint process while setting this shot region as the target shot region. On the other hand, if the imprint process has been performed for all the shot regions, the controller 10 advances to step S109.

In step S109, the controller 10 determines whether the imprint process has been performed for all the substrates 5. For example, the controller 10 determines whether the imprint process has been performed for all the substrates 5 included in one lot. If there is the substrate 5 having not undergone the imprint process, the controller 10 causes the substrate conveyance unit 12 to unload the substrate 5 from the stage 6, and then returns to step S104. On the other hand, if the imprint process has been performed for all the substrates 5, the controller 10 terminates the process. At this time, the mold 3 may be unloaded from the imprint head 4 by the mold conveyance unit 11.

Figure 3:
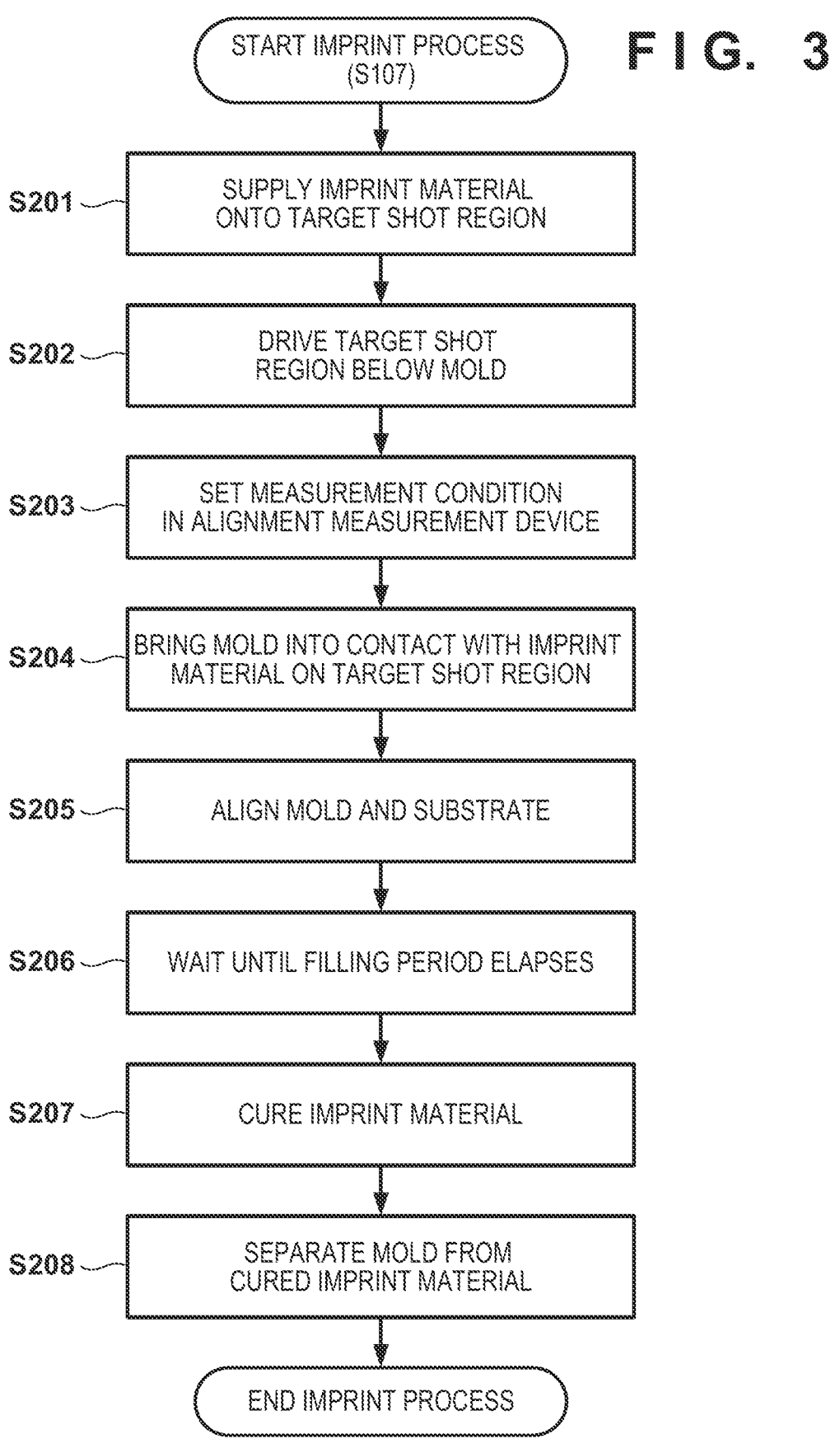
FIG. 3 is a flowchart illustrating a basic imprint process for one shot region.

Next, a basic imprint process performed in step S107 will be described. FIG. 3 is a flowchart illustrating a basic imprint process for one shot region (target shot region). The flowchart of FIG. 3 can be executed by the controller 10. FIGS. 4A to 4E show operations of the imprint apparatus 1 in respective steps of the flowchart of FIG. 3.

In step S201, as shown in FIG. 4A, the controller 10 supplies the imprint material 14 onto the target shot region of the substrate 5 by the supply unit 7 (supply process). For example, the controller 10 causes the supply unit 7 to discharge the imprint material 14 as a plurality of droplets while causing the stage 6 to move the target shot region below the supply unit 7. With this operation, it is possible to supply the imprint material 14 as the plurality of droplets onto the target shot region. The arrangement of the plurality of droplets on the target shot region can be determined in advance in accordance with the convex-concave pattern provided in the mold 3.

In step S202, as shown in FIG. 4B, the controller 10 causes the stage 6 to drive the substrate 5 so as to arrange the target shot region below the mold 3. Then, in step S203, the controller 10 sets a measurement condition in the alignment measurement device 13 (that is, adjusts the alignment measurement device 13 based on the measurement condition). The measurement condition is a condition for measuring (capturing) the mark of the target shot region in a contact state in which the mold 3 and the imprint material on the substrate 5 (target shot region) are in contact with each other. The measurement condition can include, for example, at least one of the intensity of light used to measure the position of the mark of the substrate 5 by the alignment measurement device 13, the wavelength thereof, and the charge accumulation period of the alignment measurement device 13 (image capturing element). The intensity and wavelength of light used to measure the position of the mark of the substrate 5 can include the intensity and wavelength of illumination light for illuminating the mark of the substrate 5. Note that, to facilitate understanding, step S203 is performed after steps S201 and S202 in the flowchart of FIG. 3, but it is preferable in terms of throughput to perform step S203 in parallel with steps S201 and S202.

In step S204, as shown in FIG. 4C, the controller 10 drives the mold 3 in the −Z direction by the imprint head 4, thereby bringing the mold 3 into contact with the imprint material on the target shot region (contact process). Then, in step S205, the controller 10 aligns the mold 3 (pattern region) and the substrate 5 (target shot region) in the contact state in which the mold 3 and the imprint material on the target shot region are in contact with each other (alignment process). More specifically, the controller 10 causes the alignment measurement device 13 to measure the relative position between a mark 20 of the mold 3 and a mark 21 of the target shot region and, based on the measurement result, aligns the mold 3 and the substrate 5 such that the relative position matches a target relative position. The alignment can be performed by relatively driving the mold 3 and the substrate 5 by the stage 6 and/or the imprint head 4. In step S205, the marks 20 and 21 can be measured using the measurement condition set in the alignment measurement device 13 in step S203 described above. Note that, in the following description, measurement of the relative position between the mark 20 of the mold 3 and the mark 21 of the target shot region in step S205 (alignment process) may be referred to as "alignment measurement". In addition, the contact state in which the mold 3 and the imprint material on the target shot region are in contact with each other may be simply referred to as the "contact state".

In step S206, the controller 10 waits until a filling period for filling the convex-concave pattern of the mold 3 with the imprint material elapses. Note that step S206 may be performed in parallel with step S205. For example, the alignment process between the mold 3 and the substrate 5 in step S205 may be repeatedly performed until the filling period elapses. If the relative position measured by the alignment measurement device 13 in step S205 falls within an allowable range and the filling period has elapsed in step S206, the controller 10 may transition to step S207.

In step S207, as shown in FIG. 4D, the controller 10 controls the illumination unit 2 so as to irradiate the imprint material on the target shot region with light 17 (ultraviolet light) in the contact state, thereby curing the imprint material (curing process). Then, in step S208, as shown in FIG. 4E, the controller 10 drives the mold 3 in the +Z direction by the imprint head 4, thereby separating the mold 3 from the cured imprint material on the target shot region (mold separation process).

Here, in the imprint process illustrated in FIG. 3, the measurement condition is set in the alignment measurement device 13 in step S203 before bringing the mold 3 and the imprint material on the substrate 5 into contact with each other. This is because, if the measurement condition is changed after the mold 3 and the imprint material on the substrate 5 are brought into contact with each other, the start timing of alignment between the mold 3 and the substrate 5 is delayed accordingly, and throughput can decrease. In addition, if the start timing of alignment is delayed, filling of the convex-concave pattern of the mold 3 with the imprint material progresses accordingly. In this case, the mold 3 and the substrate 5 are relatively driven in a state in which the thickness of the imprint material between the mold 3 and the substrate 5 is decreased, so that distortion can occur in the convex-concave pattern of the mold 3 due to the viscosity of the imprint material. As a result, distortion also occurs in the pattern of the cured product of the imprint material formed on the substrate. Therefore, the measurement condition is preferably set in the alignment measurement device 13 before bringing the mold 3 and the imprint material on the substrate 5 into contact with each other.

The measurement condition set in the alignment measurement device 13 in the basic imprint process can be determined by the substrate imprint process performed using a substrate on which the imprint process has been performed before the substrate 5 including the target shot region. The substrate to be used to determine the measurement condition may be understood as a condition obtainment substrate or a test substrate, and may be referred to as a "test substrate 5*b*" below. As the test substrate, a given (for example, leading) substrate of the lot, or a substrate produced under the same process condition as the substrate 5 including the target shot region can be used. Note that, in addition to determining the measurement condition, the test substrate 5*b* may also be used to obtain various conditions in the imprint process, for example, conditions such as the pressing force for pressing the mold 3 against the imprint material on the substrate and the filling period.

A conventional method of determining the measurement condition by using the test substrate 5*b* will be described below. FIG. 5 is a flowchart illustrating a conventional method of determining the measurement condition by using the test substrate 5*b*. In the conventional method, the measurement condition is determined in the imprint process of the test substrate 5*b*. Therefore, the flowchart of FIG. 5 is a flowchart illustrating the imprint process of the test substrate 5*b*, and different from the flowchart of FIG. 3 in that step S301 is added between step S205 and S206. A description of step S301 will be given below. Note that steps S201 to S208 are as described above using the flowchart of FIG. 3, and a description thereof will be omitted here. The flowchart of FIG. 5 is executed in step S107 of FIG. 2, but this flowchart is referred to as step S107-1 to discriminate it from the flowchart of FIG. 3.

In step S301, the controller 10 obtains the measurement condition (ideal measurement condition) under which alignment measurement in the contact state can be accurately performed. For example, while changing the condition/setting of alignment measurement, the controller 10 determines, as the ideal measurement condition, the optimal measurement condition under which the luminance (brightness) of each of the marks 20 and 21 in the image obtained by the image capturing element of the alignment measurement device 13 falls within the allowable range. For example, if the reflectance of the mark of the test substrate 5*b* is high, the intensity of light entering the image capturing element increases accordingly, and the image capturing element can be saturated. In this case, the luminance of the mark in the image obtained by the image capturing element becomes excessively high, and it can be difficult to accurately measure the position of the mark by the controller 10. Therefore, the measurement condition of alignment is adjusted such that the luminance of the mark in the image obtained by the image capturing element falls within the allowable range. As the measurement condition of alignment, at least one of the intensity of light entering the image capturing element, the wavelength thereof, and the charge accumulation period of the image capturing element can be used. The intensity and wavelength of light entering the image capturing element may be understood as the intensity and wavelength of illumination light for illuminating the substrate.

Here, an example will be described in which the luminance of the mark in the image obtained by the image capturing element is set to a value suitable for alignment measurement. The mark of the test substrate 5*b* is irradiated with light reduced by the ND filter. If the reflectance of the test substrate 5*b* is high, the mark is measured brightly. At this time, if the mark is excessively bright, the image capturing element is saturated. To prevent this, a threshold value is set to prevent saturation of the image capturing element, and the light is reduced by the ND filter so as to become below the threshold value. At this time, by changing the light reduction amount by the ND filter, the condition under which the mark can be measured with highest accuracy in the image obtained by the image capturing element is searched for. For example, the condition under which the difference in brightness (contrast) between the mark and the area outside the mark in the image is the largest and the image capturing element is not saturated is considered to be the condition under which the mark can be measured with highest accuracy. Setting of the ND filter satisfying this condition can be one of optimal measurement conditions (ideal measurement conditions). Setting of the ND filter may be understood as setting of the intensity of light entering the image capturing element.

A simple description of the wavelength of light entering the image capturing element will also be given. A film layer (to be sometimes referred to as an underlying film hereinafter) having some function is provided on the substrate 5 as will be described below. Depending on the kind of the underlying film and the film thickness thereof, it is difficult for light of a certain wavelength to pass the underlying film, so the mark of the substrate 5 cannot be measured or can be measured darkly. To prevent this, the condition under which the mark can be measured with highest accuracy can be searched for by switching the wavelength of light illuminating the substrate 5. The wavelength of light satisfying this condition can be one of optimal measurement conditions.

Note that, in step S203 of the flowchart of FIG. 5, the optimal measurement condition for alignment measurement is not obtained yet. Accordingly, the measurement condition to be set is unclear in this stage. Therefore, as the measurement condition, the initial setting or standard setting of the imprint apparatus 1 may be used, or the measurement condition used in the past may be used. The measurement condition set here is merely an initial value, and will be updated in step S301. Thus, basically, any condition may be used.

The flowchart of FIG. 5 is merely an example, and the order of each step is not limited to this. For example, step S301 is performed after step S205 to obtain the optimal measurement condition for alignment measurement in a state in which alignment between the mold 3 and the substrate 5 is completed. The optimal condition for alignment measurement usually depends on the underlying film and the design of the mark. Hence, step S301 may be performed before step S205. Further, step S301 may be performed after step S207.

As has been described above, the underlying film may be provided on the substrate 5. Each of FIGS. 6A to 6D shows an example of an underlying film 22 of the substrate 5. The underlying film 22 is a thin film of about several ten nm to several hundred nm provided (coated) on the surface of the substrate 5 so as to cover the mark of the substrate 5. The underlying film 22 may be understood as a part of the substrate 5. The underlying film 22 can be an insulating film of SiO$_2$ or the like, or a film to be used as a hard mask during etching. A detailed description of the material and function of the underlying film 22 will be omitted here, and the influence of the underlying film 22 on alignment measurement will be described.

It is known that the optimal measurement condition for alignment measurement is influenced by the underlying film 22 of the substrate 5. For example, when the underlying film 22 is thick, the reflectance of measurement light used for alignment measurement decreases, and the mark of the substrate 5 is measured darkly. Depending on the wavelength of measurement light, the measurement light is absorbed by the underlying film 22, so that it can be difficult for the measurement light to reach the mark of the substrate 5. It is desirable to obtain the optimal measurement condition for alignment measurement in consideration of the influence of the underlying film 22.

However, the thickness of the underlying film 22 may be different between the test substrate 5*b* and a process substrate 5*a* for which the measurement condition obtained by the test substrate 5*b* is used. For example, there can be a case in which the underlying film 22 of the test substrate 5*b* is thick as shown in FIG. 6A, and the underlying film 22 of the process substrate is thinner than that of the test substrate 5*b* as shown in FIG. 6B, or vice versa. This is because the underlying film 22 varies within a certain range depending on the accuracy of the apparatus that forms the underlying film 22. In such the case, according to the conventional method, even if the optimal measurement condition for alignment condition is obtained using the test substrate 5*b* in step S301 described above, this measurement condition may not be the optimal measurement condition for the process substrate 5*a*. As a result, this can cause an error in alignment measurement, resulting in a decrease in the final overlay accuracy.

There can also be a case in which, as shown in FIGS. 6C and 6D, the thickness of the underlying film 22 changes in one substrate in accordance with the position on the substrate. This can happen when the underlying film 22 is coated by spin coating or the like. Therefore, in the case shown in FIGS. 6C and 6D, it is desirable to individually determine the measurement condition for each shot region of the substrate 5. Further, there can be a case in which the underlying film 22 of the test substrate 5*b* is thick as shown in FIG. 6C, and the underlying film 22 of the process substrate 5*a* is thinner than that of the test substrate 5*b* as shown in FIG. 6D, or vice versa. Also in such the case, according to the conventional method, even if the measurement condition is obtained for each shot region of the test substrate 5b, this measurement condition may not be the optimal measurement condition for each shot region of the process substrate 5a.

That is, according to the conventional method, it is difficult to appropriately set the measurement condition in accordance with the thickness of the underlying film 22 that can change for each substrate and/or each shot region. Therefore, in an embodiment according to the present invention, before the contact process, a detection process is performed in which at least one of the intensity and wavelength of reflected light obtained from the substrate 5 by irradiating the substrate 5 with light is detected as an index indicating the state of the underlying film 22. The state of the underlying film 22 can include the thickness and/or material of the underlying film 22. The detection process is performed in a non-contact state in which the mold 3 and the imprint material on the substrate (on the underlying film) are not in contact with each other. The detection process may be performed, for example, before the supply process of supplying the imprint material onto the substrate 5. Then, based on the index detected in the detection process, the measurement condition for measuring the position of the mark of the substrate 5 in the contact state is determined. The measurement condition can be determined based on information indicating the correspondence relationship between the index detected in the detection process and the ideal measurement condition (optimal measurement condition or target measurement condition) for measuring the position of the mark of the substrate 5 in the contact state. The embodiment according to the present invention will be described below. Note that, in the following description, the index indicating the state of the underlying film 22 may be referred to as the "film state index" below. Further, the correspondence relationship between the film state index and the ideal measurement condition may be simply referred to as the "correspondence relationship", and the information indicating the correspondence relationship may be referred to as the "correspondence relationship information".

First Embodiment

The first embodiment according to the present invention will be described with reference to FIGS. 7 to 11F. In this embodiment, the luminance (brightness) of the mark as one of mark measurement conditions will be exemplified and described. This is because it is intuitively easy to understand and thus best describes the concept of the present invention. The illuminance of the mark may be understood as the intensity of light obtained by a detector 19 and an image capturing element of an alignment measurement device 13. The optimal light intensity, that is, the optimal luminance of the mark is that obtained in a case in which, as has been described above, the contrast is maximum within a range in which the image capturing element is not saturated. If the mark is excessively bright, that is, if the image capturing element is saturated, the intensity of light entering the image capturing element or the intensity of light which illuminates a substrate 5 (mark) needs to be adjusted by an ND filter. One of the optimal measurement conditions for alignment measurement is that the transmittance of the ND filter is optimal.

Note that examples of a method of adjusting the transmittance of the ND filter are as follows.

(1) A plurality of ND filters having different transmittances are prepared, and the ND filter whose transmittance is closest to a target transmittance is selected from the plurality of ND filters, and arranged in the optical path.

(2) An ND filter whose transmittance changes continuously or stepwise is prepared, and the portion of the ND filter corresponding to a target transmittance is arranged in the optical path.

Figure 7:
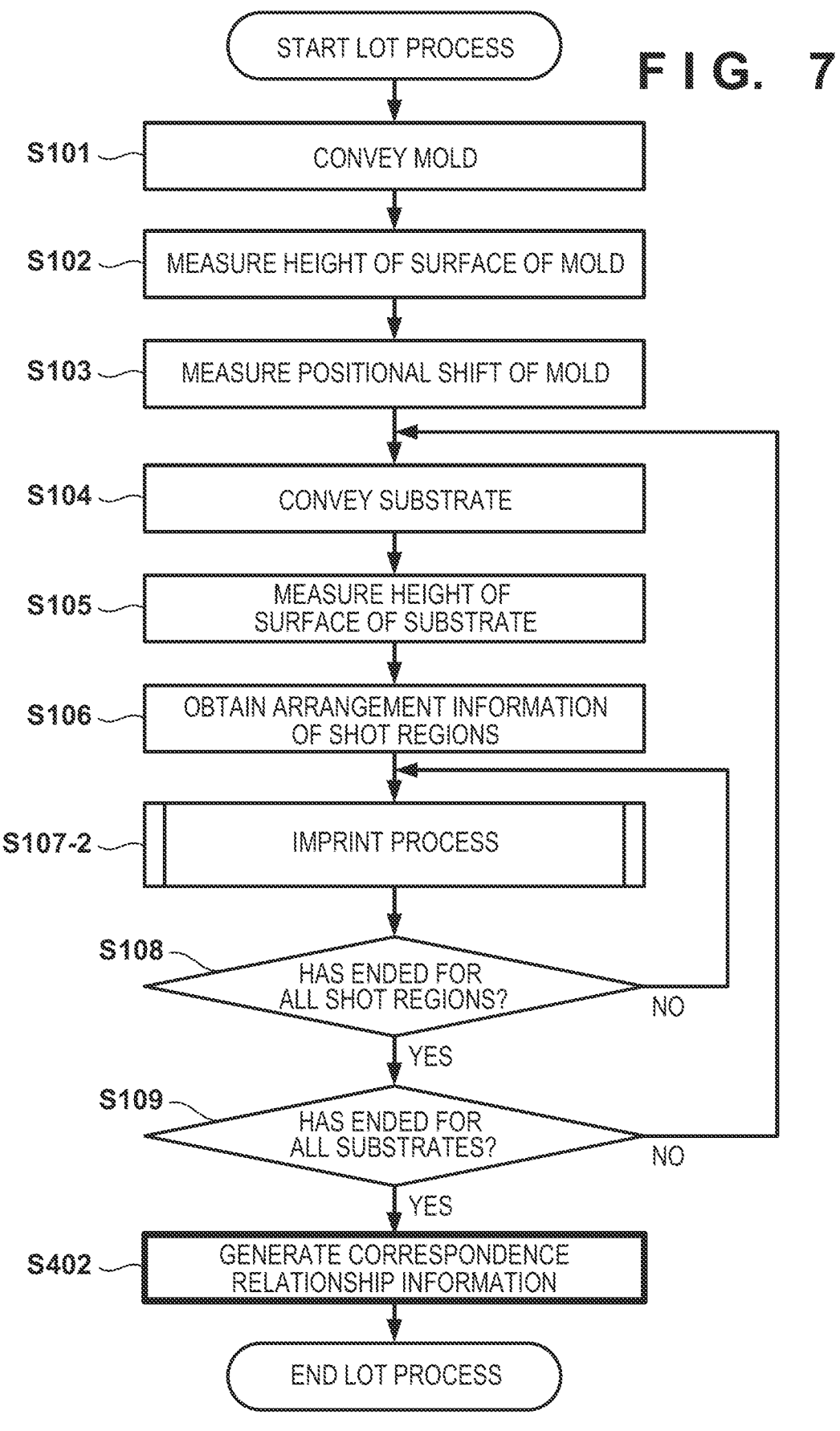
FIG. 7 is a flowchart illustrating an imprint method for generating correspondence relationship information by using a test substrate in the first embodiment.
Figure 11A:
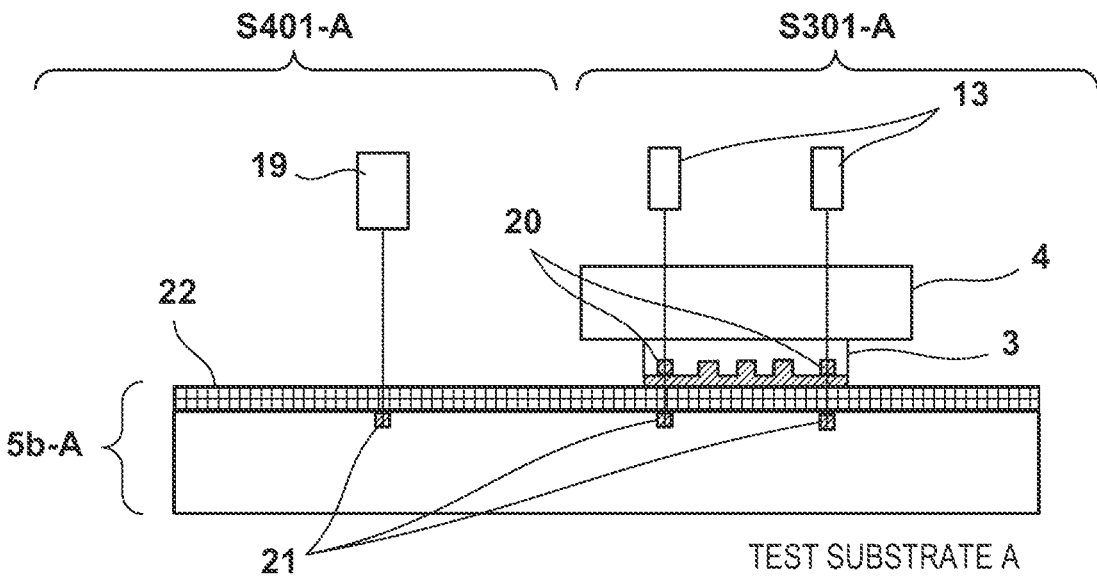
FIGS. 11A to 11F are views for explaining a method of determining a measurement condition in the first embodiment.
Figure 11B:
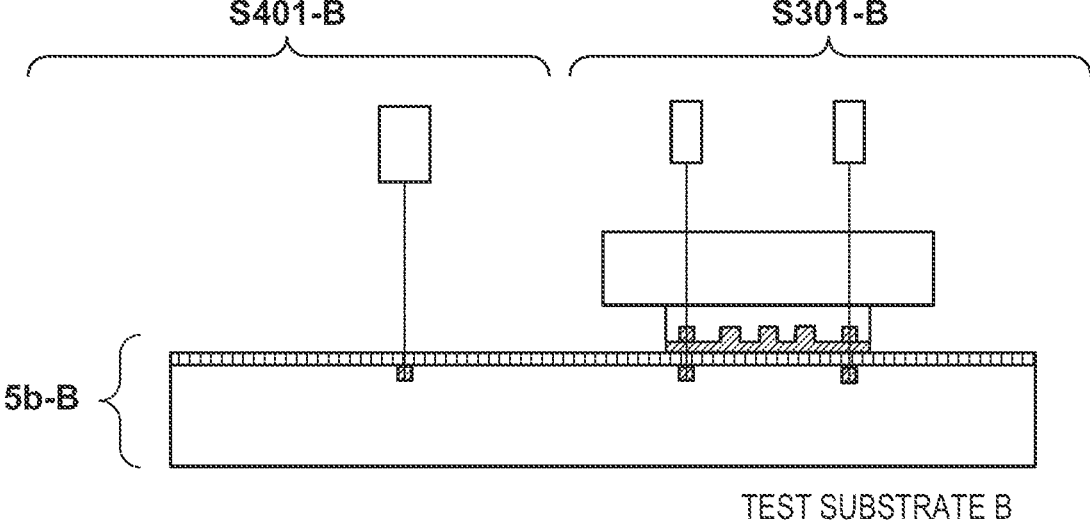

FIG. 7 is a flowchart illustrating an imprint method for generating the correspondence relationship information in this embodiment. The flowchart of FIG. 7 illustrates a lot process performed for one lot including a plurality of test substrates 5b (second substrates), and can be executed by a controller 10. As the test substrate 5b used in this imprint method, a substrate on which an actual circuit pattern is to be formed to become a product may be used. In one lot for which the flowchart of FIG. 7 is executed, at least two kinds of the test substrates 5b different from each other in the state of an underlying film 22 (in this embodiment, the thickness of the underlying film 22) can be included. FIGS. 11A and 11B show an example in which two kinds of the test substrates 5b different from each other in the thickness of the underlying film 22 are prepared. It is desirable that the two kinds of the test substrates 5b have the same parameters (for example, the mark arrangement, the pattern, and the like) as a process substrate 5a except for the thickness of the underlying film 22. In order to generate the correspondence relationship information, the flowchart of FIG. 7 can be executed before processing the lot including the process substrate 5a. If the correspondence relationship information is generated by executing the flowchart of FIG. 7, the correspondence relationship information obtained here can be used in the lot process of the process substrate 5a having undergone a process similar to that of the test substrate 5b.

Steps S101 to S106 in the flowchart of FIG. 7 are similar to those in the flowchart of FIG. 2, so that a detailed description thereof will be omitted here. However, in step S104, the test substrate 5b is conveyed onto a stage 6 as the substrate 5. Here, for example, the test substrate 5b shown in each of FIGS. 11A and 11B can be conveyed onto the stage 6.

In step S107-2, the controller 10 performs the imprint process on the target shot region of the test substrate 5b. Step S107-2 can be performed in accordance with the flowchart shown in FIG. 8. FIG. 8 is a flowchart illustrating the imprint process in step S107-2. In the flowchart of FIG. 8, step S401 is further added to the flowchart of FIG. 5.

In step S401, the controller 10 detects the film state index of the test substrate 5b by the detector 19 before bringing a mold 3 and the imprint material on the test substrate 5b into contact with each other, preferably, before supplying the imprint material onto the test substrate. The film state index can be detected by the detector 19 by, in a non-contact state in which the mold 3 and the imprint material on the test substrate are not in contact with each other, irradiating the test substrate 5b with light and detecting at least one of the intensity and wavelength of reflected light at this time. The film state index is preferably detected with respect to the mark of the test substrate 5b, but the present invention is not limited to this. The film state index may be detected with respect to a portion of the test substrate 5b other than the mark. Note that step S401 may be performed after step S208. Since steps S201 to S208 and S301 in the flowchart of FIG. 8 are similar to those in the flowchart of FIG. 5, a detailed description thereof will be omitted here.

Each of FIGS. 11A and 11B shows detection of the film state index of the test substrate 5*b* by the detector 19 (S401) and obtainment of the ideal measurement condition by the alignment measurement device 13 (S301). For the sake of illustrative simplicity, each of FIGS. 11A and 11B simultaneously shows detection of the film state index of the test substrate 5*b* (S401) and obtainment of the ideal measurement condition (S301). However, they may not be simultaneously performed. Marks 21 respectively used in detection of the film state index of the test substrate 5*b* (S401) and obtainment of the ideal measurement condition (S301) are desirably in the same shot region or nearby shot regions. Note that in FIGS. 11A and 11B, it is assumed that the thickness of the underlying film 22 is uniform in the surface of the test substrate 5*b*, but in practice, the thickness of the underlying film 22 can vary to some extent in the surface of the test substrate 5*b*.

FIG. 11A shows how the film state index is detected and how the ideal measurement condition is obtained with respect to a test substrate 5*b*-A. In step S401, the detector 19 irradiates the mark 21 of the test substrate 5*b*-A with light, and detects the intensity of reflected light from the test substrate 5*b*-A (mark 21) at that time as the film state index. For the sake of convenience, this process is referred to as step S401-A, and the film state index obtained in this process is denoted by OAS-A. In step S301, the ideal measurement condition is obtained using the alignment measurement device 13 in a contact state in which the mold 3 and the imprint material on the substrate 5*b*-A are in contact with each other. For the sake of convenience, this process is referred to as step S301-A, and the result obtained in this process is denoted by TTM-A.

When step S107-2 with respect to the test substrate 5*b*-A ends, steps S108 and S109 of FIG. 7 are performed, and then steps S104 to step S107-2 are performed with respect to a test substrate 5*b*-B. Note that the example has been described here in which the imprint process is performed on one shot region in the test substrate 5*b*-A, but the imprint process may be performed similarly on each of a plurality of shot regions in the test substrate 5*b*-A. As the number of samples (that is, the number of shot regions) used to generate the correspondence relationship increases, the more accurate correspondence relationship information can be generated accordingly.

FIG. 11B shows how the film state index is detected and how the ideal measurement condition is obtained with respect to the test substrate 5*b*-B. In step S401, the detector 19 irradiates the mark 21 of the test substrate 5*b*-B with light, and detects the intensity of reflected light from the test substrate 5*b*-B (mark 21) at that time as the film state index. For the sake of convenience, this process is referred to as step S401-B, and the film state index obtained in this process is denoted by OAS-B. In step S301, the ideal measurement condition is obtained using the alignment measurement device 13 in a contact state in which the mold 3 and the imprint material on the substrate 5*b*-B are in contact with each other. For the sake of convenience, this process is referred to as step S301-B, and the result obtained in this process is denoted by TTM-B.

When step S107-2 with respect to the test substrate 5*b*-B ends, the process advances to step S108 of FIG. 7, and then to step S109. If the imprint process has been performed for all the test substrates 5*b*, the process advances to step S402 of FIG. 7. Note that the example has been described here in which the imprint process is performed on one shot region in the test substrate 5*b*-B, but the imprint process may be performed similarly on each of a plurality of shot regions in the test substrate 5*b*-B. As the number of samples (that is, the number of shot regions) used to generate the correspondence relationship increases, the more accurate correspondence relationship information can be generated accordingly.

Figures 11C, 11D, 11E, 11F:
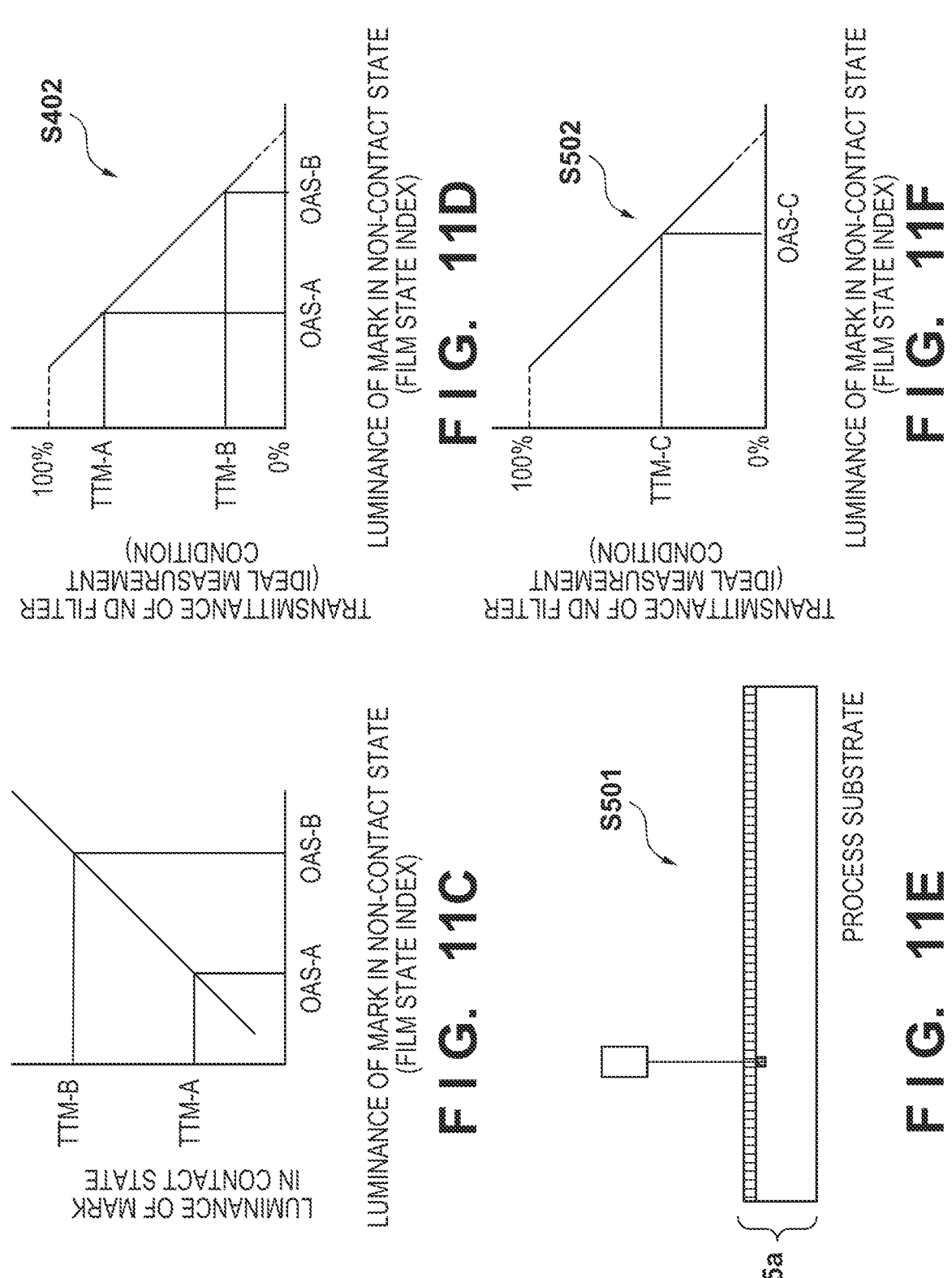

In step S402, based on the film state indices and the ideal measurement conditions obtained from the plurality of test substrates 5*b*, the controller 10 generates information (correspondence relationship information) indicating the correspondence relationship between the film state index and the ideal measurement condition as shown in FIG. 11D. In this embodiment, the transmittance of an ND filter can be used as the ideal measurement condition. To facilitate understanding of the correspondence relationship information, a description will be given using FIG. 11C.

Since the thickness of the underlying film 22 of the test substrate 5*b*-A is relatively large, light from the detector 19 and light from the alignment measurement device 13 can be partially absorbed by the underlying film 22 before reaching the mark 21 of the test substrate 5*b*-A. As a result, for the test substrate 5*b*-A, each of the detector 19 and the alignment measurement device 13 can detect the mark 21 darkly. On the other hand, since the film thickness of the underlying film 22 of the test substrate 5*b*-B is relatively small, each of the detector 19 and the alignment measurement device 13 can detect the mark 21 brightly. By plotting the detection results with the abscissa representing the luminance (brightness) of the mark detected by the detector 19 in the non-contact state, and the ordinate representing the luminance of the mark detected by the alignment measurement device 13 in the contact state, the relationship as shown in FIG. 11C can be obtained. Note that, since this relationship depends on the wavelengths of light beams used by the detector 19 and the alignment measurement device 13, respectively, the sensitivity of the image capturing element, or the like, the slope is not always "1", and may even be negative. But the description is simplified here. If the mark detected by the alignment measurement device 13 is bright, it is necessary to decrease the transmittance of the ND filter. Accordingly, when the ordinate is changed to represent the ideal measurement condition (that is, the optimal transmittance of the ND filter), as shown in FIG. 11D, a graph with the reversed slope of the graph of FIG. 11C is obtained. That is, if the mark is detected brightly by the detector 19 like OAS-B, the alignment measurement device 13 will also detect the mark brightly. In this case, the optimal transmittance of the ND filter is preferably set to be low. Similarly, if the mark is detected darkly by the detector 19 like OAS-A, the alignment measurement device 13 will also detect the mark darkly. In this case, the optimal transmittance of the ND filter is preferably set to be high. In the process in step S402 of FIG. 7, the correspondence relationship information as described above is generated.

Here, in a case in which the mark is detected darkly by the alignment measurement device 13 even if the transmittance of the ND filter is set close to 100% as the maximum, the charge accumulation period of the image capturing element of the alignment measurement device 13 or the intensity of illumination light for illuminating the mark may be increased. Similarly, in a case in which the mark is detected brightly by the alignment measurement device 13 even if the transmittance of the ND filter is set close to 0%, the charge accumulation period of the image capturing element of the alignment measurement device 13 or the intensity of illumination light for illuminating the mark may be decreased. In these cases, it is desirable to update the correspondence relationship information shown in FIG. 11D. For example, the correspondence relationship information can be updated through calculation processing. For example, in a case in which the charge accumulation period of the image capturing element of the alignment measurement device 13 is doubled, the amount of light entering the image capturing element is also doubled, so that the optimal transmittance can be halved. With such simple calculation, the correspondence relationship information can be updated. Note that in the example described above, the charge accumulation period and/or the intensity of illumination light is used when the effect of changing the transmittance of the ND filter is insufficient. However, the present invention is not limited to this, and they may be set independently of the transmittance of the ND filter. "The mark is detected brightly" and "the mark is detected darkly" may be understood to be the states in which the luminance of the detected mark falls outside an allowable range.

Figure 9:
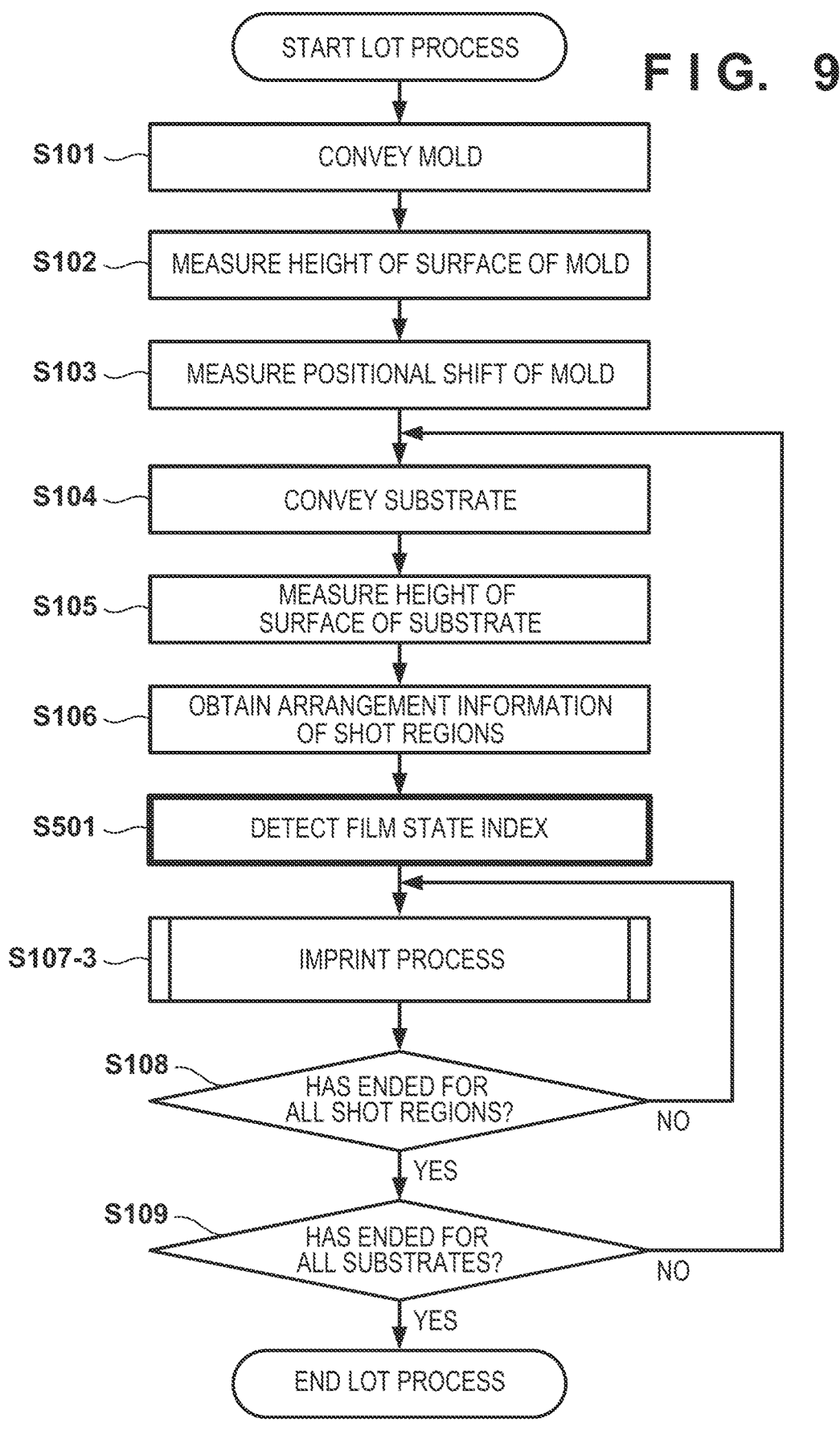
FIG. 9 is a flowchart illustrating an imprint method for a process substrate in the first embodiment.

Next, the imprint method for the process substrate 5a will be described. In the imprint method for the process substrate 5a, the measurement condition for measuring (capturing) of the mark of the process substrate 5a by the alignment measurement device 13 is determined based on the correspondence relationship information generated as described above. In this embodiment, the condition for capturing the mark of the process substrate 5a such that the luminance of the mark in an image obtained by capturing the mark of the process substrate 5a by the image capturing element of the alignment measurement device 13 falls within an allowable range is determined as the measurement condition. FIG. 9 is a flowchart illustrating an imprint method for the process substrate 5a. The flowchart of FIG. 9 illustrates a lot process performed for one lot including a plurality of the process substrates 5a, and can be controlled by the controller 10. Note that steps S101 to S106 in the flowchart of FIG. 9 are similar to those in the flowchart of FIG. 2, so that a detailed description thereof will be omitted here.

In step S501, the controller 10 detects the film state index of the process substrate 5a by the detector 19. FIG. 11E shows how the detector 19 detects the film state index of the process substrate 5a. The film state index can be detected by the detector 19 by, in the non-contact state in which the mold 3 and the imprint material on the process substrate 5a are not in contact with each other, irradiating the process substrate 5a with light and detecting at least one of the intensity and wavelength of reflected light from the process substrate 5a at this time. The film state index may be detected with respect to the mark of the process substrate 5a, but the present invention is not limited to this. The film state index may be detected with respect to a portion other than the mark of the process substrate 5a. Alternatively, the film state index may be detected with respect to each of a plurality of shot regions in the process substrate 5a, or may be detected with respect to each of at least two shot regions (sample shot regions) selected from the plurality of shot regions. In the latter case, step S501 may be performed in parallel with step S106, and may use the detection result of the detector 19 obtained in step S106.

In step S107-3, the controller 10 performs the imprint process on the target shot region of the process substrate 5a. Step S107-3 can be performed in accordance with the flowchart shown in FIG. 10. In the flowchart of FIG. 10, step S203 in the flowchart of FIG. 3 is replaced with step S502, and remaining steps S201, S202, and S204 to S208 are basically similar to those in the flowchart of FIG. 3. In step S203 of the flowchart of FIG. 3, the ideal measurement condition obtained in step S301 of the flowchart of FIG. 5 is used intact. On the other hand, in step S502 in the flowchart of FIG. 10 according to this embodiment, the measurement condition is determined/set based on the correspondence relationship information obtained using the test substrate 5b.

In step S502, based on the correspondence relationship information generated in step S402 described above, the controller 10 determines/sets the measurement condition to be used in the alignment process in step S205. A method of determining the measurement condition in step S502 will be described using FIG. 11F. The film state index has already been detected by the detector 19 in step S501 described above. Based on the correspondence relationship information generated in step S402, the controller 10 obtains the ideal measurement condition (for example, a transmittance TTM-C of the ND filter) corresponding to the film state index (OAS-C) detected in step S501. The ideal measurement condition obtained in this manner is determined as the measurement condition to be used in the alignment process in step S205. In this manner, in step S502, the measurement condition (for example, the optimal transmittance of the ND filter) of the alignment measurement device 13 in the alignment process is determined based on the correspondence relationship information generated in step S402 and the film state index detected in step S501. The determined measurement condition is set in the alignment measurement device 13.

When the flowchart of FIG. 10 ends, the process advances to step S108 of FIG. 9, and the above-described imprint process is repeated for each of the plurality of shot regions in the process substrate 5a. In addition, by step S109 of FIG. 9, the above-described imprint process is repeated for each of the plurality of the process substrates 5a in one lot. Here, since the example is described in this embodiment in which the thickness of the underlying film 22 is constant in one process substrate 5a, the measurement condition to be commonly used for the plurality of shot regions in the process substrate 5a is determined. For example, the controller 10 can calculate the representative value of the film state indices detected for at least two sample shot regions in step S501, and determine the ideal measurement condition corresponding to the representative value as the measurement condition to be commonly used for the plurality of shot regions in the process substrate 5a. As the representative value, an average value, a median value, or a most frequent value can be used. In this case, step S502 may be omitted for the shot regions which undergo the second or subsequent imprint process.

In this embodiment, the detector 19 is used as a unit that detects the film state index (abscissa) of the correspondence relationship information shown in each of FIGS. 11C, 11D, and 11F, but the alignment measurement device 13 may be used in place of the detector 19. In this case, in step S401 of FIG. 8, the controller 10 can irradiate the test substrate 5b with light by the alignment measurement device 13, and detect, as the film state index, at least one of the intensity and wavelength of reflected light from the test substrate 5b at that time.

As has been described above, in this embodiment, the film state index is detected in the non-contact state before the contact process, and the measurement condition for measuring the position of the mark of the process substrate 5a in the contact state is determined based on the film state index. With this, even if the thickness of the underlying film 22 of the process substrate 5a is uncertain, it is possible to determine the measurement condition suitable for the thickness of the underlying film 22, and accurately measure the mark of the process substrate 5a. In addition, since a step of changing the measurement condition in the contact state is unnecessary, this embodiment can also be advantageous in terms of throughput.

Second Embodiment

The second embodiment according to the present invention will be described. In the first embodiment described above, to facilitate understanding, the example in which the thickness of the underlying film 22 is uniform in one substrate, but the thickness of the underlying film 22 changes for each substrate 5 has been described as a simplest example. However, in practice, as shown in FIGS. 6C and 6D, the thickness of the underlying film 22 can change in the substrate depending on the location. As has been described above, it is known that when the underlying film 22 is formed on the substrate 5 by spin coating or the like, the thickness distribution of the underlying film 22 is concentrically formed in the substrate. Therefore, in the second embodiment, it will be described that the present invention is also effective in a case in which the thickness of an underlying film 22 changes in a substrate. Note that this embodiment basically is derived from the first embodiment, and follows the first embodiment except for matters to be described below.

FIGS. 12A and 12B show an example of a test substrate 5b. In the test substrate 5b shown in FIGS. 12A and 12B, the thickness of the underlying film 22 changes for each location in the substrate. In this embodiment, the correspondence relationship information between the film state index and the ideal measurement condition can be generated by using such the test substrate 5b in accordance with the flowcharts shown in FIGS. 7 and 8 described above. Points different from the first embodiment in generation of the correspondence relationship information will be mainly described below.

In step S401 in the flowchart of FIG. 8, as shown in FIG. 12A, a controller 10 detects the film state index by a detector 19 for the target shot region of the test substrate 5b. Detection of the film state index in step S401 is performed with respect to a mark in the target shot region, preferably, with respect to the mark to be measured by an alignment measurement device 13 in the alignment process in step S205. This is to make the influence of the thickness of the underlying film 22 similar to that in step S301 in which an ideal measurement condition is obtained in a contact state. However, if it is difficult to detect the film state index with respect to the mark in the target shot region, the film state index may be detected with respect to a portion of the target shot region other than the mark or a mark in a shot region in the vicinity of the target shot region.

In step S301, as shown in FIG. 12B, the controller 10 obtains an ideal measurement condition under which alignment measurement in the contact state can be accurately performed. Since step S301 is as described above, a detailed description will be omitted here. The ideal measurement condition can be obtained with respect to the same target shot region as in step S401.

When step S107-2 with respect to the target shot region ends, the process advances to step S108, and step S107-2 is repeated for each of a plurality of shot regions. In the first embodiment described above, step S107-2 may be performed on one shot region in the test substrate 5b. On the other hand, in this embodiment, step S107-2 can be performed on at least two shot regions of the plurality of shot regions in the test substrate 5b, and preferably on all the shot regions thereof. Note that in this embodiment, the example has been described in which step S401 and step S301 are alternately performed while changing the shot region. However, the present invention is not limited to this. For example, after performing step S401 on the plurality of shot regions, steps S201 to S209 (including step S301) may be performed individually on each shot region.

In this manner, since the thickness of the underlying film 22 changes for each location in one test substrate 5b, the correspondence relationship between the film state index and the ideal measurement condition can be obtained by using one test substrate 5b alone. Note that, in one test substrate 5b, if the difference in the thickness of the underlying film 22 is small in the substrate, it is difficult to accurately generate correspondence relationship information. Therefore, as in the first embodiment, the correspondence relationship information may be desirably generated using a plurality of the test substrates 5b different from each other in the thicknesses of the underlying film 22. For example, a plurality of the test substrates 5b as shown in FIGS. 6C and 6D may be used to generate the correspondence relationship information. If it is determined in step S109 of FIG. 7 that there are a plurality of the test substrates 5b, steps S104 to S109 are repeated with respect each of the plurality of the test substrates 5b. With this, the controller 10 can accurately generate the correspondence relationship information in step S402.

Figures 12C, 12D, 12E, 12F:
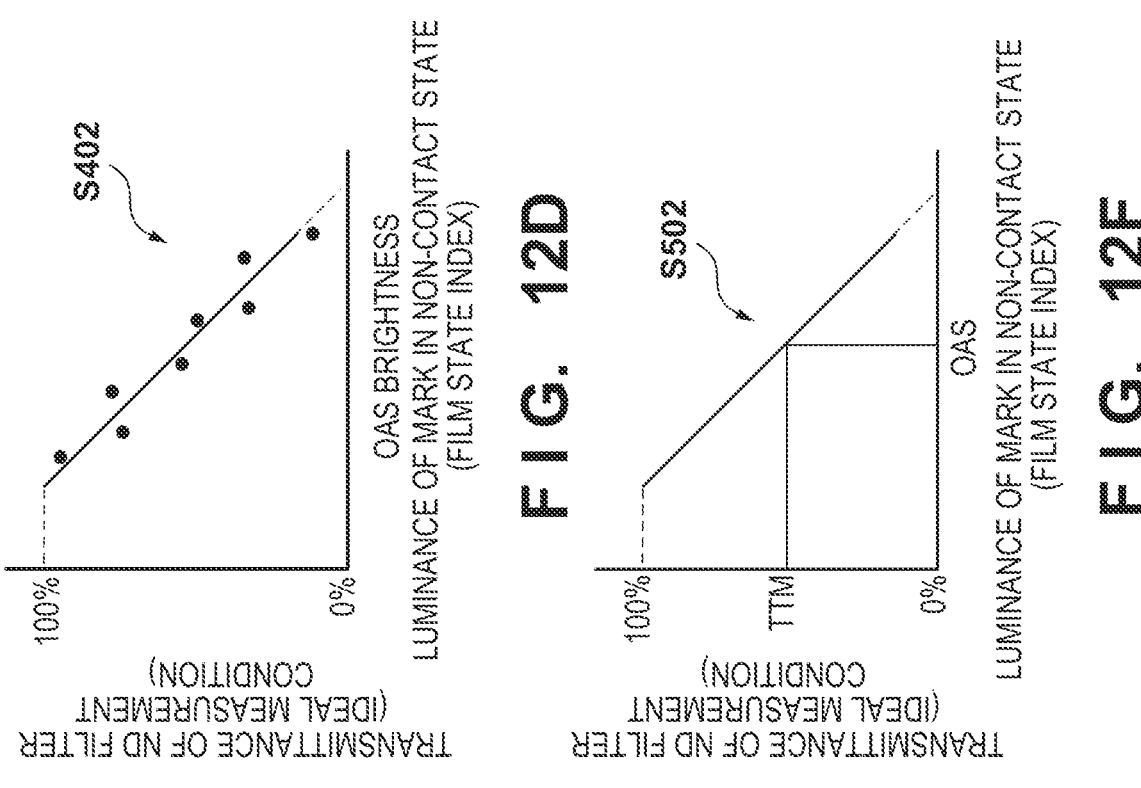

Generation of the correspondence relationship information in this embodiment will be described below by exemplifying the brightness of the mark (that is, the transmittance of an ND filter). Also in this embodiment, the correspondence relationship information can be generated basically as in the first embodiment. As in FIG. 11C, FIG. 12C shows the relationship between the luminance (brightness) of the mark detected by the detector 19 in the non-contact state and the luminance of the mark detected by the alignment measurement device 13 in the contact state. In the example shown in FIG. 11C described above, the graph is created using two detection results. However, in the example shown in FIG. 12C, many detection results have been obtained, and a graph is created by approximating the many detection results with a first- or higher-order function. By using the plurality of the test substrates 5b different from each other in the thicknesses of the underlying film 22 as shown in FIGS. 6C and 6D, it is possible to obtain may detection results over a wider range, thereby more accurately obtaining an approximation function. Similar to FIG. 11D, FIG. 12D is a graph with the reversed slope of the graph of FIG. 12C, and this serves as the correspondence relationship information. If the mark is detected brightly by the detector 19, the alignment measurement device 13 will also detect the mark brightly. In this case, the optimal transmittance of the ND filter can be set to be low. Similarly, if the mark is detected darkly by the detector 19, the alignment measurement device 13 will also detect the mark darkly. In this case, the optimal transmittance of the ND filter can be set to be high.

Here, also in FIG. 12D, the maximum value of the transmittance of the ND filter is set to 100% as in FIG. 11D. In a case in which the mark is detected darkly by the alignment measurement device 13 even if the transmittance of the ND filter is set close to 100% as the maximum, the charge accumulation period of the image capturing element of the alignment measurement device 13 or the intensity of illumination light for illuminating the mark may be increased. Similarly, in a case in which the mark is detected brightly by the alignment measurement device 13 even if the transmittance of the ND filter is set close to 0%, the charge accumulation period of the image capturing element of the alignment measurement device 13 or the intensity of illumination light for illuminating the mark may be decreased.

In this embodiment, as in the first embodiment, an imprint process with respect to a process substrate 5a can be performed in accordance with the flowcharts of FIGS. 9 and 10 described above. The process of the imprint process with respect the process substrate 5a different from the first embodiment will be mainly described below.

In the first embodiment, the thickness of the underlying film 22 is uniform in one substrate, so that detection of the film state index in step S501 and determination of the measurement condition in step S502 only need to be performed once for each process substrate 5a. On the other hand, in this embodiment, the thickness of the underlying film 22 changes for each location in the substrate, so that detection of the film state index in step S501 needs to be performed at each of a plurality of locations in the substrate. For example, the controller 10 detects the film state index by the detector 19 for each of at least two sample shot regions in the process substrate 5a, and performs function approximation of the detection results in the substrate. With this, it is possible to obtain the film state index for each of the plurality of shot regions in the process substrate 5a.

In step S501, the controller 10 detects the film state index of the process substrate 5a by the detector 19. FIG. 12E shows how the detector 19 detects the film state index of the process substrate 5a. Here, detection of the film state index in step S501 of this embodiment can be performed for each sample shot region in which the mark is detected by the detector 19 in step S106. Hence, step S501 may be performed in parallel with step S106, and may use the detection result of the detector 19 obtained in step S106. In this case, in steps S106 and S501, the controller 10 detects the position of the mark and the film state index for each sample shot region by the detector 19. Then, based on the detection result of the detector 19, the controller 10 calculates the arrangement of the plurality of shot regions in the process substrate 5a, and calculates the film state index of each shot region by performing function approximation of the film state indices obtained for the respective sample shot regions. With this, selecting (setting) a sample shot region used only for detection of the film state index or the like can be omitted. This can be advantageous in terms of throughput.

In step S502, based on the correspondence relationship information generated in step S402, the controller 10 determines the measurement condition to be used in an alignment process in step S205. A method of determining the measurement condition in step S502 will be described using FIG. 12F. The film state index has already been detected by the detector 19 in step S501 described above. Based on the correspondence relationship information generated in step S402, the controller 10 obtains the ideal measurement condition (for example, the transmittance of the ND filter) corresponding to the film state index (OAS-C) detected in step S501. The ideal measurement condition obtained in this manner is determined as the measurement condition to be used in the alignment process in step S205. In this manner, in step S502, the measurement condition (for example, the optimal transmittance of the ND filter) of the alignment measurement device 13 in the alignment process is determined based on the correspondence relationship information generated in step S402 and the film state index detected in step S501. The measurement condition of the alignment measurement device 13 can be determined for each of the plurality of shot regions in the process substrate 5a. The determined measurement condition is set in the alignment measurement device 13. Note that step S502 may be performed in parallel with steps S201 and S202. With this, throughput can be improved.

Once the measurement condition is determined/set in step S502, steps S204 to S208 are processed. The imprint process performed in steps S201 to S208 (including step S502) can be performed on each of the plurality of shot regions in one process substrate 5a. Further, by step S109 of FIG. 9, the imprint process described above is repeated for each of a plurality of the process substrates 5a in one lot. The process in step S501 is also performed on the new process substrate 5a, and the film state index of each of the plurality of shot regions can be obtained by performing function approximation of the film state indices of the respective sample shot regions. For example, the correspondence relationship information generated in step S402 can be used not only for the plurality of the process substrates 5a in one lot, but also commonly used for a plurality of the process substrates 5a in another lot. That is, also for the process substrate 5a whose thickness of the underlying film 22 is unknown, the measurement condition for measuring the position of the mark by the alignment measurement device 13 can be determined/set based on the correspondence relationship information generated in step S402.

Here, in this embodiment, the example has been described in which the film state index of each shot region is obtained by performing function approximation of the film state indices detected in the respective sample shot regions. However, the present invention is not limited to this. For example, after determining the measurement condition of each shot region based on the film state index detected in each sample shot region, the measurement condition of each shot region may be obtained by performing function approximation of the measurement conditions of the respective sample shot regions. That is, information held before performing function approximation may be the film state index of each sample shot region or the measurement condition of each sample shot region.

Further, in this embodiment, the example has been described in which the film state index of each sample shot region is detected in step S501 to achieve a high degree of compatibility between the accuracy of alignment measurement (mark measurement accuracy) and throughput. However, the present invention is not limited to this, and the film state index may be detected for each of the plurality of shot regions in the process substrate 5a. In this case, throughput can slightly decrease as compared to the example in which the film state index is detected only for each sample shot region, but the measurement condition of each shot region can be more accurately obtained. As a result, alignment measurement can be performed with higher accuracy.

Third Embodiment

The third embodiment according to the present invention will be described. This embodiment basically derives from the first embodiment, and follows the first embodiment except for matters to be described below. The second embodiment may be applied to this embodiment.

As has been described above in the first and second embodiments, in order to generate the correspondence relationship information in step S402, it is necessary to prepare a plurality of the test substrates 5b different from each other in the thickness of the underlying film 22. In this case, the burden of preparing the plurality of the test substrates 5b is large, and it can take a considerable time to generate the correspondence relationship information. Therefore, in this embodiment, an example will be described in which the correspondence relationship information is generated more easily. Generation of the correspondence relationship information is performed in accordance with the flowcharts of FIGS. 7 and 8 described above, and points different from the first and second embodiments will be mainly described below.

As has been described above, if the underlying film 22 of the substrate 5 is thick, the reflectance of measurement light used in alignment measurement decreases, and the mark of the substrate 5 is measured darkly. Of course, also in an image obtained by capturing the mark by the alignment measurement device 13 in a contact state, the mark becomes dark. In a graph representing this, due to the difference in optical property between the detector 19 and the alignment measurement device 13, the slope of the graph may not be "1", and it is unknown. Therefore, in the first embodiment, the example has been described in which the correspondence relationship information is generated using two kinds of film state indices as shown in FIG. 11C, and in the second embodiment, the example has been described in which the correspondence relationship information is generated using many kinds of film state indices as shown in FIG. 12C.

In this manner, the slope of the graph in the correspondence relationship information is unknown until the film state index and the brightness of the mark at that time are actually obtained. However, there is no large error even if it is assumed that the intercept is 0. This is because, if the brightness of the mark is 0 in the non-contact state, it can be estimated that the brightness of the mark in the contact state is also 0 or close to 0. FIG. 13A shows that if the luminance (brightness) of the mark can be obtained for one film state index, a graph passing through this plot and an origin can be obtained as information indicating the relationship between the film state index and the luminance of the mark. By reversing the slope of the graph shown in FIG. 13A, the correspondence relationship information can be generated as shown in FIG. 13B. That is, if the ideal measurement condition can be obtained for one kind of the film state index, the correspondence relationship information can be generated as shown in FIG. 13B. In this case, the intercept of the graph representing the correspondence relationship information may be set at 100% of the transmittance of the ND filter as the ideal measurement condition. Accordingly, for example, when only one test substrate 5b as shown in FIG. 12A is prepared, the correspondence relationship information can be generated in step S402. Note that the correspondence relationship information is not limited to be generated using only one ideal measurement condition obtained for one kind of the film state index, but the correspondence relationship information may be generated using the representative value (for example, the average value) of a plurality of ideal measurement conditions obtained for one kind of the film state index. In this case, the correspondence relationship information can be generated with higher accuracy.

Fourth Embodiment

The fourth embodiment according to the present invention will be described. This embodiment basically derives from the first embodiment, and follows the first embodiment except for matters to be described below. The second embodiment and/or the third embodiment may be applied to this embodiment.

In the first to third embodiments described above, the example has been described in which the luminance of the mark (that is, the intensity of reflected light from the substrate 5) is used. However, in addition to the luminance of the mark, the measurement condition of alignment measurement may be the wavelength of incident light entering the image capturing element of the alignment measurement device 13 (to be sometimes simply referred to as "the wavelength of incident light hereinafter). The film state index may be the wavelength of reflected light from the substrate 5. In this embodiment, an example will be described in which the wavelength of light is used to generate the correspondence relationship information and determine the measurement condition of alignment measurement. Note that the wavelength of incident light may be understood as the wavelength of illumination light for illuminating a substrate 5 (mark) to perform alignment measurement and/or the wavelength of reflected light from the substrate 5 in alignment measurement.

The basic idea in this embodiment is similar to that in the first to third embodiments. FIG. 14A shows correspondence relationship information obtained in step S402. Note that, in the correspondence relationship information shown in FIG. 14A, the film state index represented on the abscissa is the wavelength of light detected by a detector 19 in a non-contact state, and the ideal measurement condition represented on the ordinate is the wavelength of light detected by an alignment measurement device 13 in a contact state.

Generation of the correspondence relationship information in this embodiment will be described below by exemplifying the wavelength of light. Also in this embodiment, the correspondence relationship information is generated in accordance with the flowcharts of FIGS. 7 and 8 basically as in the first embodiment. Note that, in the first embodiment, the intensity of light (for example, the luminance of the mark) detected by the detector 19 in the non-contact state is used as the film state index in step S401 of FIG. 8. On the other hand, in this embodiment, the wavelength of light detected by the detector 19 in the non-contact state is used as the film state index. Further, in the first embodiment, the ideal measurement condition is obtained using the intensity of incident light (for example, the luminance of the mark) detected by the alignment measurement device 13 in the contact state in step S301 of FIG. 8. On the other hand, in this embodiment, the ideal measurement condition is obtained using the wavelength of incident light detected by the alignment measurement device 13 in the contact state. For example, while changing the wavelength of light illuminating the mark of a test substrate 5b by the alignment measurement device 13, a controller 10 obtains, as the ideal measurement condition, the wavelength with which the state of the mark in an image obtained by the image capturing element of the alignment measurement device 13 falls within an allowable range. Examples of the state of the mark are the luminance (brightness) and/or contrast of the mark in the image obtained by the image capturing element of the alignment measurement device 13. In this manner, by obtaining the wavelength of light as the film state index in step S401, and obtaining the wavelength of incident light as the ideal measurement condition in step S301, the controller 10 can generate the correspondence relationship information as shown in FIG. 12A in step S402.

In this embodiment, as in the first embodiment, an imprint process with respect to a process substrate 5a can be performed in accordance with the flowcharts of FIGS. 9 and 10 described above. However, in step S501, the controller 10 detects, as the film state index, the wavelength of reflected light from the process substrate 5a by the detector 19. Then, in step S502, based on the correspondence relationship information, the controller 10 determines/sets, as the measurement condition, the wavelength of measurement light to be used by the alignment measurement device 13 in the alignment process in step S205.

Here, in this embodiment, in addition to the wavelength of light, the intensity of light may be further used as the film state index and the measurement condition. For example, in a case in which the mark of the process substrate 5a is detected brightly or darkly by the alignment measurement device 13, the charge accumulation period of the image capturing element of the alignment measurement device 13 or the intensity of light (for example, the intensity of illumination light or the transmittance of an ND filter) may be further adjusted as the measurement condition. FIG. 14B shows, as the correspondence relationship information, the correspondence relationship between the luminance of the mark detected as the film state index by the detector 19 in the non-contact state and the charge accumulation period obtained as the ideal measurement condition. FIG. 14C shows, as the correspondence relationship information, the correspondence relationship between the luminance of the mark detected as the film state index by the detector 19 in the non-contact state and the intensity of illumination light obtained as the ideal measurement condition. In step S502, based on the correspondence relationship information shown in each of FIGS. 14A to 14C, at least one of the intensity of light, the wavelength of light, and the charge accumulation period can be determined/set as the measurement condition of alignment measurement.

By applying the embodiment described above, even in a case in which the influence of the state (for example, material or thickness) of an underlying film 22 of the process substrate 5a changes for each process substrate 5a or each shot region, alignment measurement can be performed under the measurement condition suitable for the state of the underlying film 22. Note that the drawings and flowcharts used in each embodiment are merely examples for the sake of descriptive convenience, and the present invention is not limited to them. It should be noted that a replacement, a change, or a modification can be made unless it goes against the intent of the invention. In addition, in the embodiment described above, the example has been described in which the detector 19 performs detection in the non-contact state and the alignment measurement device 13 performs detection in the contact state. However, the present invention is not limited to this, and the alignment measurement device 13 may also perform detection in the non-contact state. Further, in the diagrams and flowcharts used in the embodiment described above, priority is given to ease of understanding, so it should be noted that some parts are not based on reality.

<Embodiment of Article Manufacturing Method>

An article manufacturing method according to an embodiment of the present invention is suitable for manufacturing an article, for example, a microdevice such as a semiconductor device or an element having a fine structure. The article manufacturing method according to this embodiment includes a forming step of forming a composition on a substrate using the above-described forming method by a forming apparatus (imprint apparatus or planarization apparatus), a processing step of processing the substrate on which the composition has been formed, and a manufacturing step of manufacturing an article from the processed substrate. The manufacturing method also includes other known steps (oxidation, deposition, vapor deposition, doping, planarization, etching, resist removal, dicing, bonding, packaging, and the like). The article manufacturing method according to this embodiment is advantageous in at least one of the performance, quality, productivity, and production cost of the article, as compared to conventional methods.

The pattern of a cured product formed using the forming apparatus described above is used permanently for at least some of various kinds of articles or temporarily when manufacturing various kinds of articles. The articles are an electric circuit element, an optical element, a MEMS, a recording element, a sensor, a mold, or the like. Examples of the electric circuit element are volatile and nonvolatile semiconductor memories such as a DRAM, an SRAM, a flash memory, and an MRAM and semiconductor elements such as an LSI, a CCD, an image sensor, and an FPGA. The mold includes an imprint mold or the like.

The pattern of the cured product is directly used as the constituent member of at least some of the above-described articles or used temporarily as a resist mask. After etching or ion implantation is performed in the substrate processing step, the resist mask is removed.

A practical article manufacturing method in a case where an imprint apparatus is used as a forming apparatus will be described next. As shown FIG. 15A, a substrate 1z such as a silicon wafer with a processed material 2z such as an insulator formed on the surface is prepared. Next, an imprint material 3z is applied to the surface of the processed material 2z by an inkjet method or the like. A state in which the imprint material 3z is applied as a plurality of droplets onto the substrate is shown here.

As shown in FIG. 15B, a side of a mold 4z for imprint with a convex-concave pattern is directed to face the imprint material 3z on the substrate. As shown FIG. 15C, the mold 4z and the substrate 1z to which the imprint material 3z has been applied are brought into contact with each other, and a pressure is applied. The gap between the mold 4z and the processed material 2z is filled with the imprint material 3z. In this state, when the imprint material 3z is irradiated with light as curing energy via the mold 4z, the imprint material 3z is cured.

As shown in FIG. 15D, after the imprint material 3z is cured, the mold 4z is separated from the substrate 1z, and the pattern of the cured product of the imprint material 3z is formed on the substrate 1z. In the pattern of the cured product, the concave portion of the mold corresponds to the convex portion of the cured product, and the convex portion of the mold corresponds to the concave portion of the cured product. That is, the convex-concave pattern of the mold 4z is transferred to the imprint material 3z.

As shown in FIG. 15E, when etching is performed using the pattern of the cured product as an etching resistant mask, a portion of the surface of the processed material 2z where the cured product does not exist or remains thin is removed to form a groove 5z. As shown in FIG. 15F, when the pattern of the cured product is removed, an article with the grooves 5z formed in the surface of the processed material 2z can be obtained. Here, the pattern of the cured product is removed. However, instead of removing the pattern of the cured product after the process, it may be used as, for example, an interlayer dielectric film included in a semiconductor element or the like, that is, a constituent member of an article.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2022-208798 filed on Dec. 26, 2022, which is hereby incorporated by reference herein in its entirety.

What is claimed is:

1. A forming method of forming a composition on an underlying layer of a substrate by using a mold, the method including:

detecting, as an index indicating a state of the underlying layer, at least one of an intensity and a wavelength of reflected light obtained from the substrate by irradiating the substrate with light;

determining, based on the index detected in the detecting, a measurement condition for measuring a position of a mark of the substrate;

bringing the mold and the composition on the substrate into contact with each other; and measuring, after the bringing, in a contact state in which the mold and the composition are in contact with each other, the position of the mark of the substrate under the measurement condition determined in the determining, and aligning the mold and the substrate based on a measurement result, wherein the detecting the index indicating the state of the underlying layer and the determining the measurement condition for measuring the position of the mark of the substrate based on the detected index are performed before the bringing the mold and the composition on the substrate into contact with each other.

2. The method according to claim 1, wherein in the aligning, the position of the mark of the substrate is measured based on an image obtained by capturing an image of the mark of the substrate, and in the determining based on the index detected in the detecting, a condition under which the image of the mark of the substrate is captured, such that a luminance of the mark in the image falls within an allowable range, is determined as the measurement condition.

3. The method according to claim 2, wherein the condition under which the image of the mark of the substrate is captured includes at least one of an intensity of light used to measure the position of the mark of the substrate, a wavelength thereof, and a charge accumulation period of an image capturing device configured to capture the image of the mark of the substrate.

4. The method according to claim 1, wherein in the determining, the measurement condition to be used in the aligning is determined further based on information indicating a correspondence relationship between the index detected in the detecting and a condition for measuring the position of the mark of the substrate in the contact state.

5. The method according to claim 4, further including generating the information by using a second substrate different from the substrate before the detecting.

6. The method according to claim 1, wherein the detecting is performed with respect to each of at least two shot regions selected from a plurality of shot regions in the substrate, and in the determining, the measurement condition is determined for each of the plurality of shot regions based on the index detected in the detecting for each of the at least two shot regions.

7. The method according to claim 6, further including obtaining arrangement information of the plurality of shot regions in the substrate by detecting a mark of each of the at least two shot regions, wherein the detecting is performed in parallel with the obtaining.

8. The method according to claim 1, wherein the detecting is performed with respect to each of at least two shot regions selected from a plurality of shot regions in the substrate, and in the determining, the measurement condition to be commonly used for the plurality of shot regions is determined based on the index detected in the detecting for each of the at least two shot regions.

9. The method according to claim 8, further including obtaining arrangement information of the plurality of shot regions in the substrate by detecting a mark of each of the at least two shot regions, wherein the detecting is performed in parallel with the obtaining.

10. The method according to claim 1, wherein the state of the underlying layer includes a thickness of the underlying layer.

11. An article manufacturing method including:

forming a composition on a substrate by using a forming method defined in claim 1;

processing the substrate including the composition formed in the forming; and manufacturing an article from the substrate processed in the processing.

12. A forming apparatus that forms a composition on an underlying layer of a substrate by using a mold, the apparatus comprising:

a detector configured to detect, as an index indicating a state of the underlying layer, at least one of an intensity and a wavelength of reflected light obtained from the substrate by irradiating the substrate with light;

a measurement device configured to measure a position of a mark of the substrate; and a controller, wherein the controller is configured to cause the detector to detect the at least one of the intensity and the wavelength of the reflected light, as the index indicating the state of the underlying layer, before bringing the mold and the composition on the substrate into contact with each other, determine, based on the index detected by the detector and before bringing the mold and the composition on the substrate into contact with each other, a measurement condition for measuring the mark of the substrate by the measurement device, cause, after bringing the mold and the composition on the substrate into contact with each other, the measurement device to measure the mark of the substrate under the measurement condition, and control alignment between the mold and the substrate based on a measurement result of the mark of the substrate measured under the measurement condition.

* * * * *